United States Patent
Kurokawa

(10) Patent No.: US 8,227,837 B2
(45) Date of Patent: Jul. 24, 2012

(54) SEMICONDUCTOR DEVICE AND DISPLAY DEVICE

(75) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/277,253

(22) Filed: Oct. 20, 2011

(65) Prior Publication Data

US 2012/0032181 A1 Feb. 9, 2012

Related U.S. Application Data

(60) Division of application No. 12/173,836, filed on Jul. 16, 2008, now Pat. No. 8,058,672, which is a continuation of application No. 10/742,925, filed on Dec. 23, 2003, now Pat. No. 7,408,196.

(30) Foreign Application Priority Data

Dec. 25, 2002 (JP) ................................ 2002-373491

(51) Int. Cl.
*H01L 23/52* (2006.01)
(52) U.S. Cl. ...... 257/207; 257/59; 257/72; 257/E27.112
(58) Field of Classification Search .................. 257/207, 257/59, 72, E27.112
See application file for complete search history.

(56) References Cited

U.S. PATENT DOCUMENTS

| 4,947,229 A | 8/1990 | Tanaka et al. |
|---|---|---|
| 5,339,181 A | 8/1994 | Kim et al. |
| 5,446,410 A | 8/1995 | Nakakura |
| RE36,278 E | 8/1999 | Nakakura |
| 6,190,942 B1 | 2/2001 | Wilm et al. |
| 6,326,693 B1 | 12/2001 | Mimoto et al. |
| 6,341,087 B1 | 1/2002 | Kunikiyo |
| 6,346,717 B1 * | 2/2002 | Kawata ........................ 257/72 |

(Continued)

FOREIGN PATENT DOCUMENTS

JP 63-040347 2/1988

(Continued)

OTHER PUBLICATIONS

Kim, S.S. et al., 4:3: High-Aperture and Fault-Tolerant Pixel Structure for TFT-LCDs, SID 95 Digest, SID International Symposium Digest of Technical Papers, 1995, pp. 15-18.

(Continued)

Primary Examiner — Tu-Tu Ho
(74) Attorney, Agent, or Firm — Nixon Peabody LLP; Jeffrey L. Costellia

(57) ABSTRACT

It is an object of the invention to provide a thin, lightweight, high performance, and low in cost semiconductor device and a display device by reducing an arrangement area required for a power supply wiring and a ground wiring of a functional circuit and decreasing a drop in power supply voltage and a rise in ground voltage. In the functional circuit of the semiconductor device and the display device, a power supply wiring and a ground wiring are formed in a comb-like arrangement, and the tips thereof are electrically connected with a first wiring, a second wiring, and a contact between the first wiring and the second wiring, thereby forming in a grid-like arrangement. The drop in power supply voltage and the rise in ground voltage can be decreased and the arrangement area can be decreased in the grid-like arrangement.

18 Claims, 10 Drawing Sheets

U.S. PATENT DOCUMENTS

| | | |
|---|---|---|
| 6,384,727 B1 | 5/2002 | Diprizio et al. |
| 6,724,149 B2 | 4/2004 | Komiya et al. |
| 6,828,584 B2 | 12/2004 | Arao et al. |
| 7,408,196 B2 | 8/2008 | Kurokawa |
| 2002/0126108 A1 | 9/2002 | Koyama et al. |
| 2003/0117347 A1 | 6/2003 | Hunter et al. |
| 2004/0150351 A1 | 8/2004 | Komiya et al. |

FOREIGN PATENT DOCUMENTS

| | | |
|---|---|---|
| JP | 63-170939 | 7/1988 |
| JP | 01-189936 | 7/1989 |
| JP | 02-030176 | 1/1990 |
| JP | 03-123076 | 5/1991 |
| JP | 05-226584 | 9/1993 |
| JP | 06-021225 | 1/1994 |
| JP | 10-107152 | 4/1998 |
| JP | 2000-058763 | 2/2000 |
| JP | 2002-033456 | 1/2002 |
| JP | 2004-103821 | 4/2004 |

OTHER PUBLICATIONS

Kim, S.S. et al., "4:3: High-Aperture and Fault-Tolerant Pixel Structure for TFT-LCDs," SID 95 Digest, SID International Symposium Digest of Technical Papers, 1995, vol. 26, pp. 15-18.

* cited by examiner

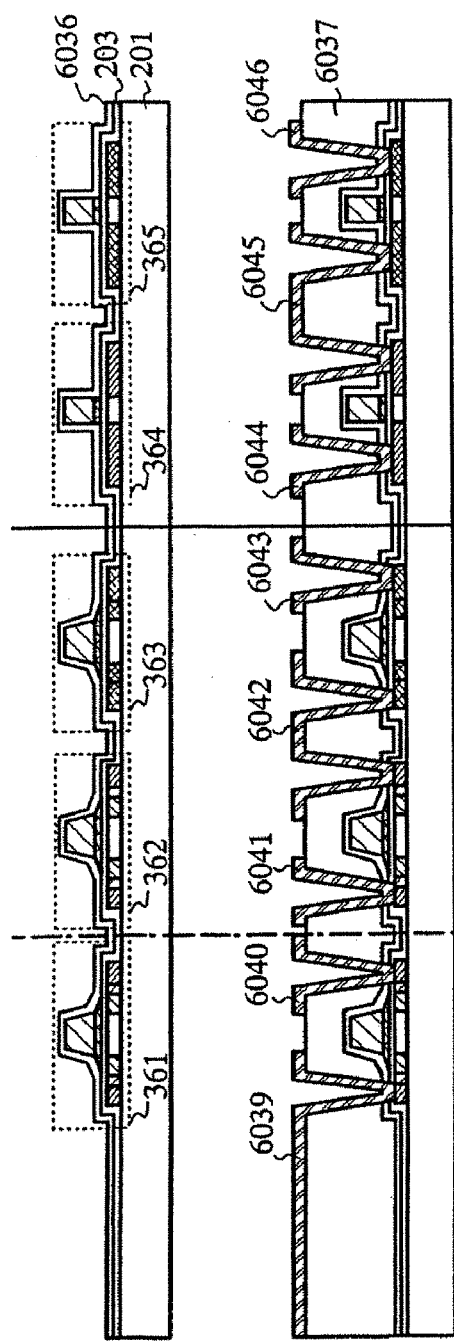
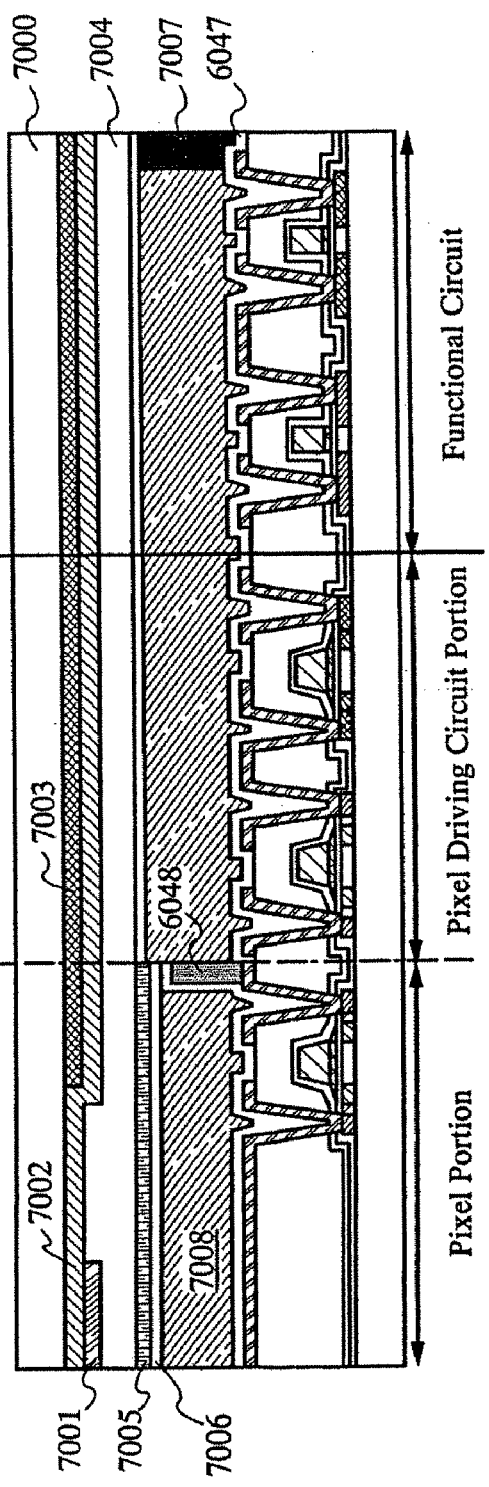
FIG. 7A
FIG. 7B
FIG. 7C

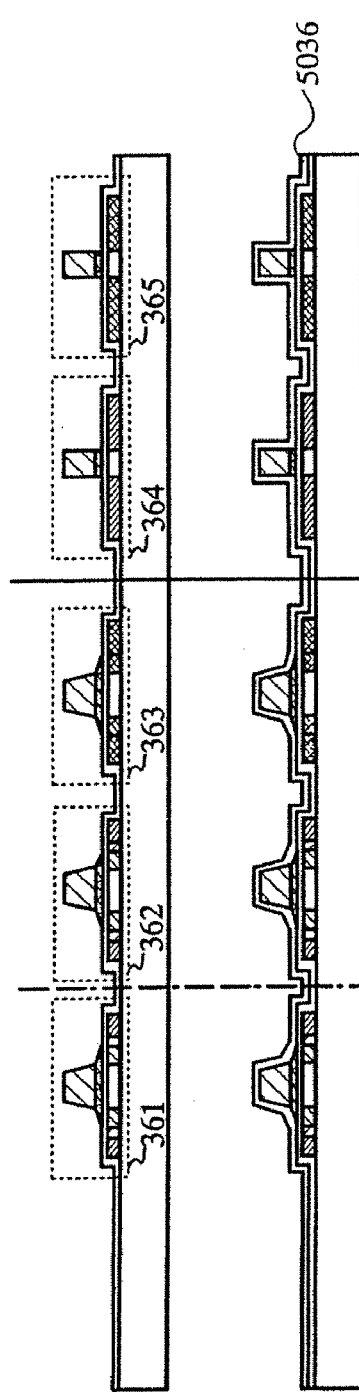
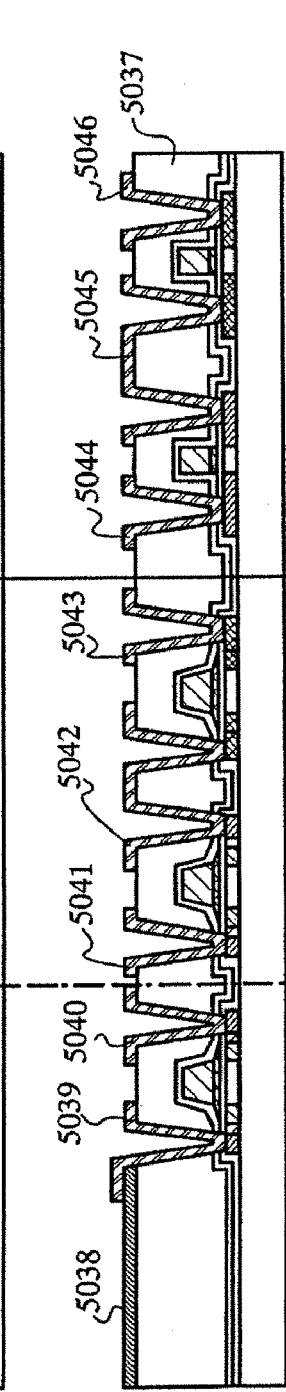
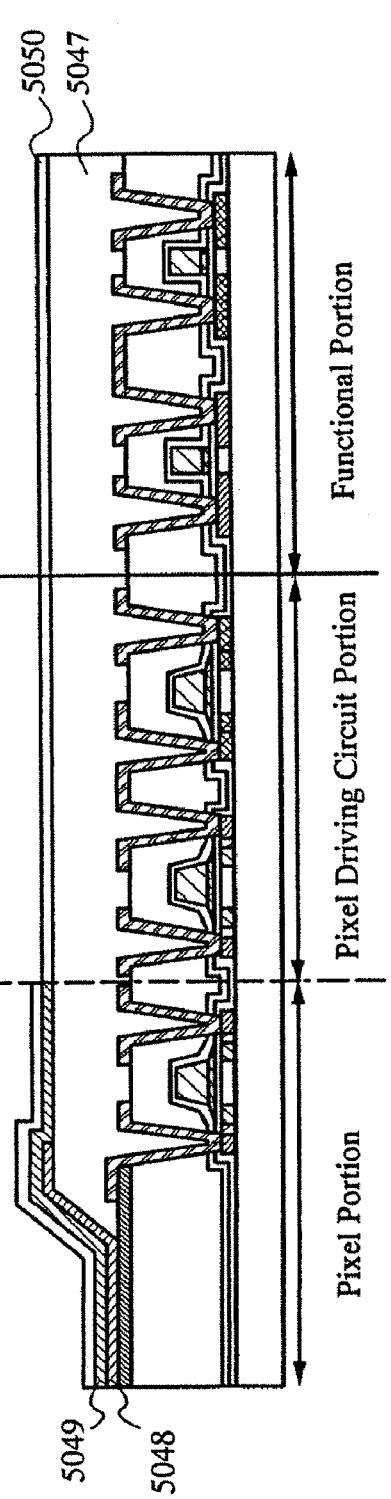
FIG. 8A
FIG. 8B
FIG. 8C
FIG. 8D

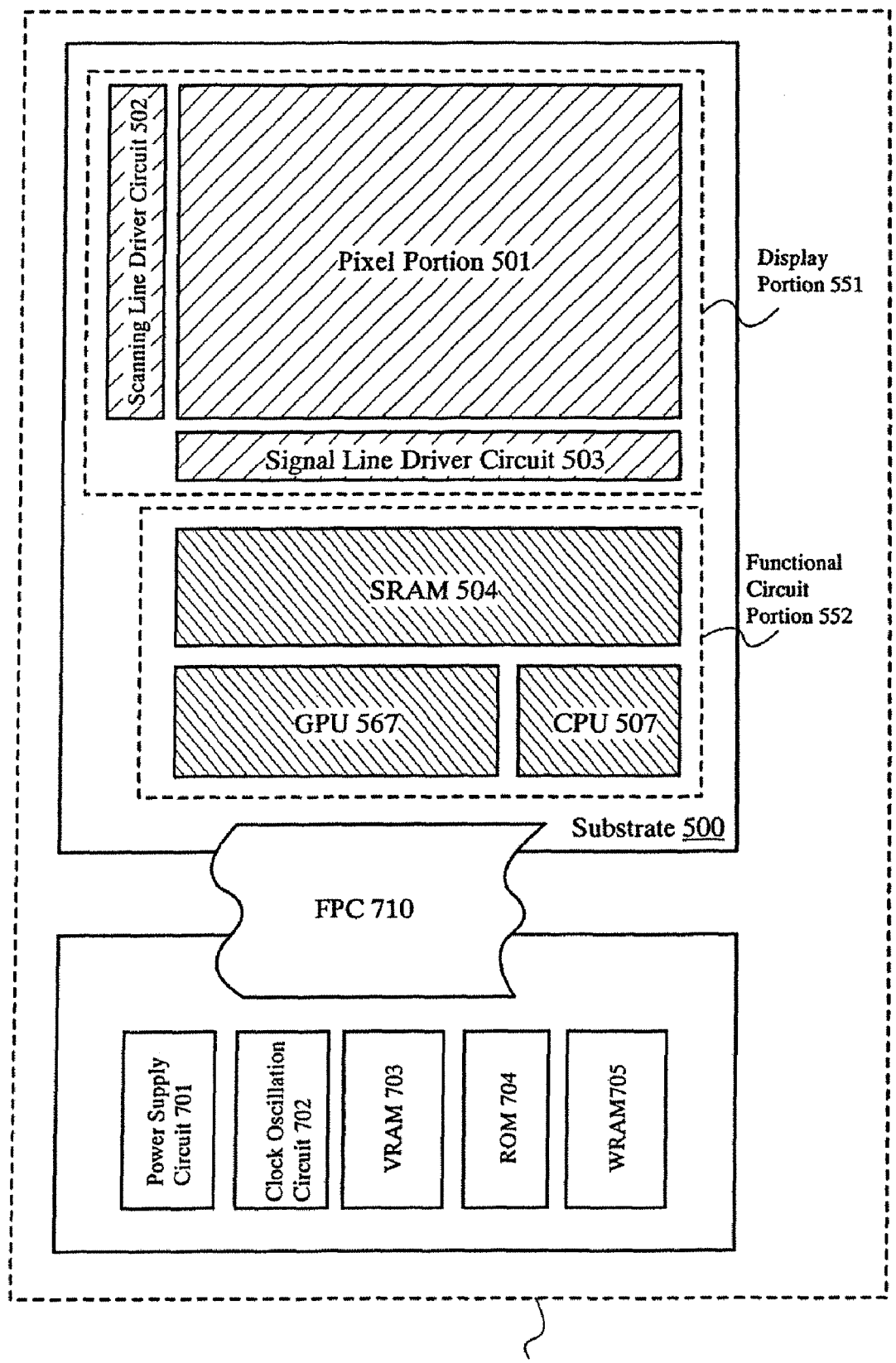
FIG. 9  Display System 700

SEMICONDUCTOR DEVICE AND DISPLAY DEVICE

BACKGROUND OF THE INVENTION

1. Field of the Invention

The present invention relates to a semiconductor device and a display device. Specifically, the present invention relates to a semiconductor device and a display device which are lightweight, thin, and can realize a high performance at a low cost.

2. Description of the Related Art

Recently, research and development have eagerly been made on a display device for which a thin film transistor (TFT) is fabricated by using a polycrystalline silicon thin film as an active layer and provides as a switching element in a pixel portion, and an active matrix display device for which a circuit is provided so as to drive a pixel in the periphery of a pixel portion.

Furthermore, by using such high performance TFTs, research and development for providing a functional circuit represented by a large scale integrated circuit (LSI) over an insulating substrate have been started. The functional circuit conventionally could only be provided over a single crystalline semiconductor such as single crystalline silicon. It is to be noted that examples of such functional circuit include a central processing unit (CPU), a memory, an image processing circuit, a digital signal processor and the like. It is expected that a functional circuit which is thin, lightweight, and has low power consumption can be provided at a low cost by using TFTs. Therefore, a semiconductor device having a functional circuit formed by using TFTs and a display device in which a functional circuit formed by using TFTs is mounted on the same substrate are quite promising as future merchandises.

Generally, a CPU is expected to have a high processing performance. In the conventional development of LSI, processing performance of CPU has been improved by improving the operation frequency using multilayer wiring technology, for example. In the multilayer wiring technology, independent layers are employed in wirings in a basic cell, wirings in each block of a functional circuit, wirings between blocks, power supply wirings, ground wirings and the like. By forming such a multiplayer wiring, a chip area can be smaller and an operation speed can be higher. Furthermore, a memory is generally expected to have a high storage capacity and high read-out speed. In this case also, the multilayer wiring technology is very effective.

SUMMARY OF THE INVENTION

The important thing in manufacturing a functional circuit formed by using TFTs at a low cost is to use as few masks as possible. That is, CPU and a memory are required to be made by using as few masks as possible. In the conventional multilayer wiring technology, however, at least two masks are required to increase one wiring layer. Therefore, the conventional multilayer technology is not necessarily an efficient method when the functional circuit formed by using TFTs is manufactured.

In a typical liquid crystal display device, wirings are formed by using a wiring layer (a first wiring layer) which is used as a gate wiring of a TFT and a lead wiring between TFTs, secondly a wiring layer (a second wiring layer) which is used as a lead wiring between TFTs, a power supply wiring, and a ground wiring, thirdly a contact which connects above-described layers electrically. Therefore, in order to mount a functional circuit on the same substrate without increasing the number of masks, wirings of a functional circuit are required to be formed by using these two wiring layers and the contact, too.

To realize an advanced functional circuit, lead wirings between TFTs are very complicated, which lead to occupying a large area. Therefore, in order to reduce the area for a whole functional circuit, the power supply wiring and the ground wiring are required to be made thin so that the arrangement area occupied by the power supply wiring and the ground wiring can be as small as possible. Although, electrical resistances of the power supply wiring and the ground wiring are in inverse proportion to the widths of the power supply wiring and the ground wiring. Therefore, the electrical resistance increases more as the power supply wiring and the ground wiring become narrower. As a result, a power supply voltage drops rapidly in a local circuit of high current consumption. A net power supply voltage applied to the TFT is decreased drastically in the area that the power supply voltage is dropped, and therefore it cannot provide as much TFT performance as expected. This may lead to a malfunction of circuit or a problem such that the designed operation frequency might not be obtained.

Similarly, a ground voltage rises, which may lead to a malfunction of circuit or a problem such that the designed operation frequency might be obtained. In this specification, a drop in a net power supply voltage and a rise in a net ground voltage applied to a TFT are referred to as a drop in a power supply voltage collectively, unless otherwise specified.

Thus, a power supply wiring and a ground wiring are required to be arranged with the first wiring layer, the second wiring layer and the contact at the same time of forming a gate wiring and a lead wiring between TFTs while occupying as a small area as possible for the power supply wiring and the ground wiring, and further keeping the power supply voltage and the ground voltage equal at each part of the functional circuits.

The present invention is made in view of above-described problems in order to provide a semiconductor device and a display device which include lightweight, thin, and high performance functional circuits by the manufacturing functional circuits formed by using TFTs with as few masks as possible while occupying as small area as possible for wirings of the functional circuits, and further keeping the power supply voltage and the ground voltage equal at each part of the functional circuits.

In a functional circuit which is formed by using TFTs in a semiconductor device and a display device of the present invention, a power supply wiring and a ground wiring are formed in a comb-like arrangement by using the second wiring and the tips of the wirings formed in the comb-like arrangement are electrically connected with the first wiring and a contact between the first wiring and the second wiring. By using the first wiring, the contact between the first wiring and second wiring, and the second wiring, the power supply wiring and the ground wiring are formed in a grid-like arrangement. The extends of a drop in a power supply voltage and a rise in ground voltage can be drastically decreased in the grid-like arrangement by comparison with the case where the grid-like arrangement is not employed. Furthermore, in the case where the width of wiring are thinned, a drop in a power supply voltage and a rise in a ground voltage can be suppressed to the extent in the case where a grid-like arrangement is not employed, resulting in a drastic decrease in the arrangement area required for the power supply wiring and the ground wiring. Moreover, an electrostatic capacitor can be formed between the power supply wiring and the ground wiring at the same time of forming the power supply wiring and the ground wiring. The electrostatic capacitor suppresses the change in the absolute value of potential due to a momentary change in potential, therefore the electrostatic capacitor is preferably provided in terms of a circuit operation.

Thus, a semiconductor device and a display device are provided which include functional circuits by manufacturing the functional circuits formed by using TFTs with as few masks as possible while occupying as a small area as possible for wirings of the functional circuits, and further keeping the power supply voltage and the ground voltage equal at each part of the functional circuits. In this manner, a semiconductor device and a display device which are higher in performance and added value can be provided at a low cost.

A structure of the invention disclosed in this specification comprising:

a semiconductor device comprising a functional circuit including a TFT;

wherein a power supply wiring which supplies a power supply voltage to the functional circuit and a ground wiring which supplies a ground voltage to the functional circuit are formed in a grid-like arrangement.

Further, another structure of the invention comprising:

a semiconductor device comprising a functional circuit including a TFT;

wherein at least one of a power supply wiring which supplies a power supply voltage to the functional circuit or a ground wiring which supplies a ground voltage to the functional circuit is formed in a grid-like arrangement.

In the above-described structure, the functional circuit may comprise a central processing unit.

In the above-described structure, the functional circuit may comprise a memory device.

In the above-described structure, the functional circuit may comprise a static memory.

In the above-described structure, the functional circuit may comprises a dynamic memory.

In the above-described structure, the functional circuit may comprise a nonvolatile memory.

In the above-described structure, a semiconductor thin film formed over a substrate having an insulating surface is used as an active layer of the TFT.

In the above-described structure, the substrate having an insulating surface may be a glass substrate.

In the above-described structure, the substrate having an insulating surface may be a quartz substrate.

In the above-described structure, the substrate having an insulating surface may be a plastic substrate.

In the above-described structure, the substrate having an insulating surface may be an SOI substrate.

Furthermore, in the above-described structure, at least one of the power supply wiring or the ground wiring may comprise a first conductive thin film, a second conductive thin film, a third conductive thin film, a first contact which connects the first conductive thin film and the second conductive thin film electrically, a second contact which connects the first conductive thin film and the third conductive thin film electrically, and a third contact which connects the second conductive thin film and the third conductive thin film electrically.

Moreover, in the above-described structure, at least one of the power supply wiring or the ground wiring may comprise a first conductive thin film, a second conductive thin film, and a first contact which connects the first conductive thin film and the second conductive thin film electrically.

Another structure of the invention comprising:

a display device comprising a functional circuit including a TFT;

wherein a power supply wiring which supplies a power supply voltage to the functional circuit and a ground wiring which supplies a ground voltage to the functional circuit are formed in a grid-like arrangement.

Another structure of the invention comprising:

a display device comprising a functional circuit including a TFT;

wherein at least one of a power supply wiring which supplies a power supply voltage to the functional circuit or a ground wiring which supplies a ground voltage to the functional circuit is formed in a grid-like arrangement.

In the above-described structure, the functional circuit may comprise a central processing unit.

In the above-described structure, the functional circuit may comprise a memory device.

In the above-described structure, the functional circuit may comprise a static memory.

In the above-described structure, the functional circuit may comprise a dynamic memory.

In the above-described structure, the functional circuit may comprise a nonvolatile memory.

In the above-described structure, the functional circuit may comprise an image processing circuit.

In the above-described structure, the functional circuit may comprise a digital signal processor.

In the above-described structure, a semiconductor thin film formed over a substrate having an insulating surface is used as an active layer of the TFT.

In the above-described structure, the substrate having an insulating surface may be a glass substrate.

In the above-described structure, the substrate having an insulating surface may be a quartz substrate.

In the above-described structure, the substrate having an insulating surface may be a plastic substrate.

In the above-described structure, the substrate having an insulating surface may be an SOI substrate.

Furthermore, in the above-described structure, at least one of the power supply wiring or the ground wiring may comprise a first conductive thin film, a second conductive thin film, a third conductive thin film, a first contact which connects the first conductive thin film and the second conductive thin film electrically, a second contact which connects the first conductive thin film and the third conductive thin film electrically, and a third contact which connects the second conductive thin film and the third conductive thin film electrically.

Moreover, in the above-described structure, at least one of the power supply wiring or the ground wiring may comprise a first conductive thin film, a second conductive thin film, and a first contact which connects the first conductive thin film and the second conductive thin film electrically.

Furthermore, it is effective to incorporate a semiconductor device of the above-described structure or a display device of the above-described structure in an electronic device.

BRIEF DESCRIPTION OF THE DRAWINGS

FIGS. 7A to 7C are diagrams showing methods of manufacturing a liquid crystal display device of the present invention.

FIGS. 8A to 8D are diagrams showing methods of manufacturing an OLED display device of the present invention.

FIG. 9 is a diagram showing a display system using a display device of the present invention.

DETAILED DESCRIPTION OF THE PREFERRED EMBODIMENTS

Embodiment Mode 1

Figure 1:
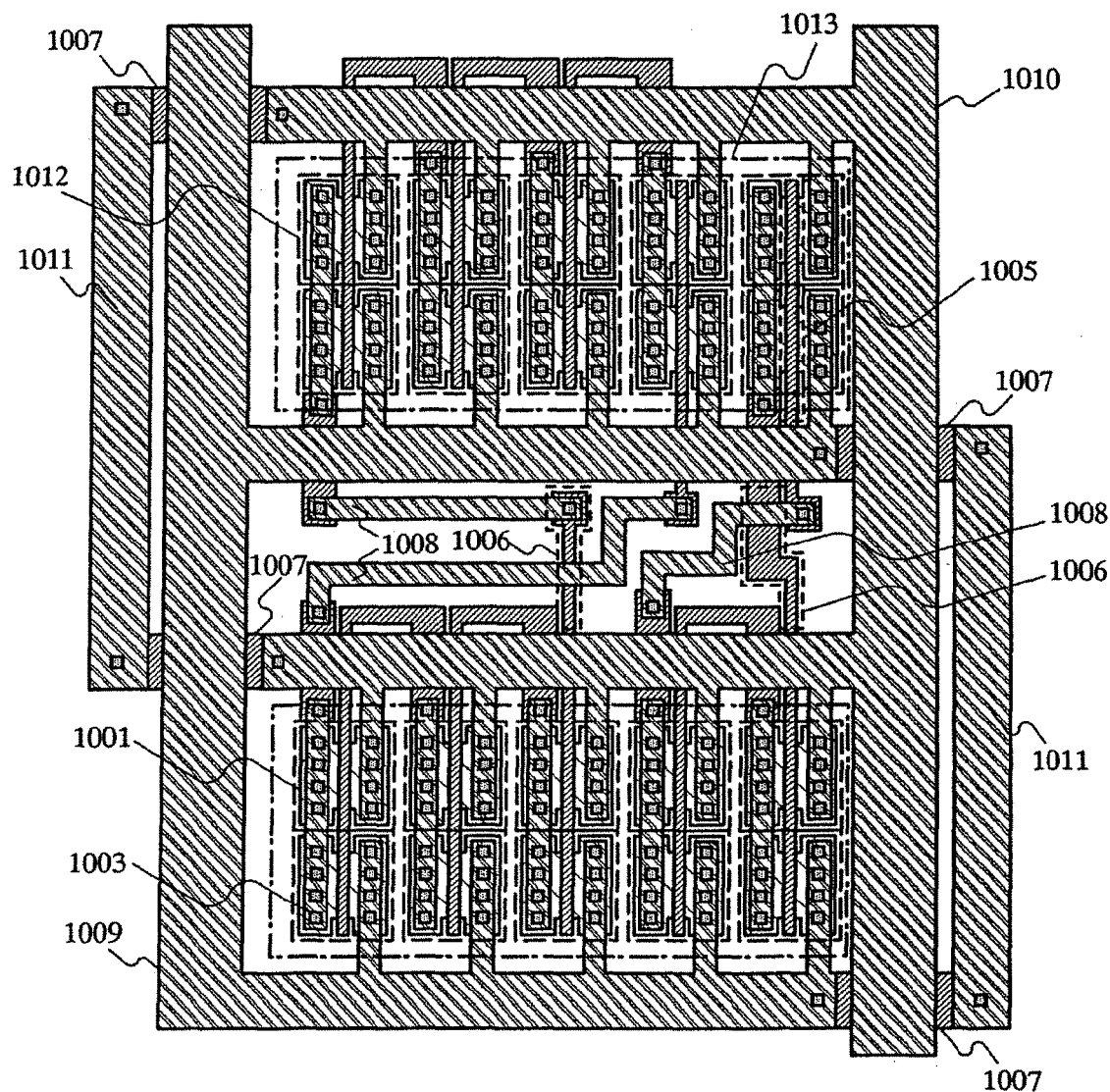
FIG. 1 is a mask layout of a functional circuit of a semiconductor device and a display device of the present invention.

In this embodiment mode, a mask layout of a functional circuit in a semiconductor device and a display device according to the present invention is described. FIG. 1 shows a mask layout of this embodiment mode.

FIG. 1 shows an active layer 1001 which corresponds to a channel region, a source region, and a drain region of a TFT, a first wiring layer including a gate wiring 1005, a wiring 1006 between TFTs, and a first wiring 1007 which forms a power supply wiring or a ground wiring in a grid-like arrangement (hereinafter referred to as a first wiring for forming in a grid-like arrangement), a contact 1003 for connecting the first wiring and a second wiring or the active layer and the second wiring electrically, a second wiring layer including a wiring 1008 between TFTs, a power supply wiring 1009, a ground wiring 1010, and the second wiring 1011 which forms a power supply wiring or a ground wiring in a grid-like arrangement (hereinafter referred to as a second wiring for forming in a grid-like arrangement). An electric circuit 1013 is formed by using equal to or more than one TFT 1012.

This embodiment mode is characterized in that the first wiring 1007 for forming in a grid-like arrangement and a second wiring 1011 for forming in a grid-like arrangement are formed, to which the tips of the power supply wiring 1009 in a comb-like arrangement and the tips of the ground wiring 1010 in a comb-like arrangement are connected electrically at each part of the tips through the contact 1003. It is to be noted that the second wiring 1011 for forming in a grid-like arrangement may be provided newly for connecting electrically as shown in FIG. 1, otherwise a wiring provided for supplying a power supply voltage or a ground voltage to other circuits may be used as well.

Although a mask for an impurity doping and the like are required in actual manufacturing steps of TFTs, they are omitted because they are unessential in the invention.

Figure 2A:
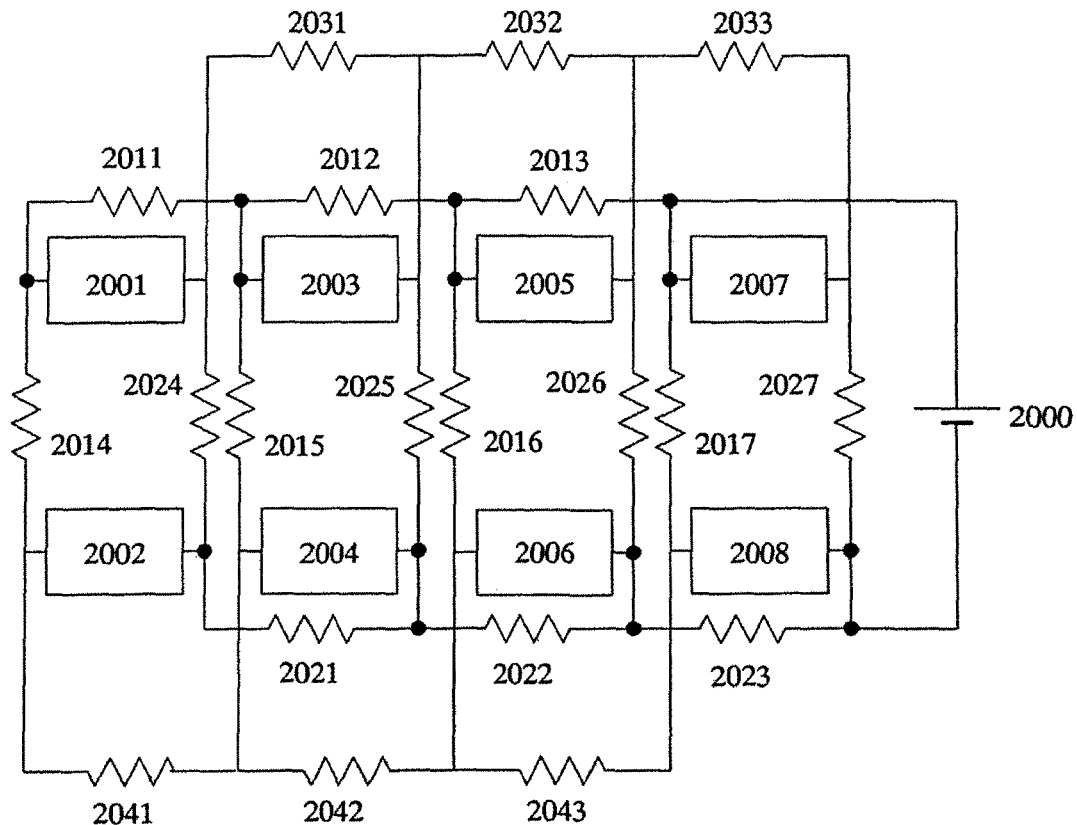
FIGS. 2A and 2B are equivalent circuits of FIG. 1.
Figure 2B:
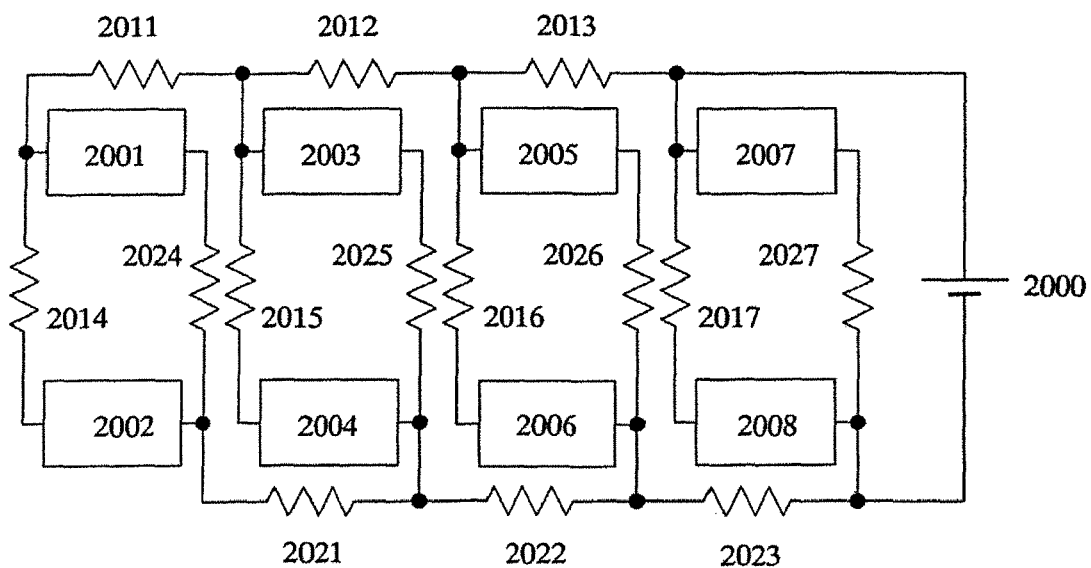

FIG. 2A shows a typical equivalent circuit of a power supply wiring and a ground wiring in the case where a functional circuit is made according to the layout shown in FIG. 1. FIG. 2B shows an equivalent circuit in the case where the tips of the power supply wiring 1009 in a comb-like arrangement and the tips of the ground wiring 1010 in a comb-like arrangement are not connected electrically. Resistors 01 (2011) to 07 (2017) denote electrical resistors of the power supply wiring and resistors 11 (2021) to 17 (2027) denote electrical resistors of the ground wiring. Further, resistors 21 (2031) to 23 (2033) denote equivalent electric resistors in the case where the tips of the ground wiring in a comb-like arrangement are short-circuited with a wiring for forming in a grid-like arrangement and a contact. Also, resistors 31 (2041) to 33 (2043) denote equivalent electric resistors in the case where the tips of the power supply wiring in a comb-like arrangement are short-circuited with a wiring for forming in a grid-like arrangement and a contact. A potential of supply voltage source 2000 is supplied to circuits 1 (2001) to 8 (2008) through these resistors. Therefore, net potentials supplied to the circuits 1 (2001) to 8 (2008) are lower than an output value of the supply voltage source 2000.

The net potentials supplied to the circuit 1 (2001) to the circuit 8 (2008) in the equivalent circuits of FIGS. 2A and 2B estimating a drop in power supply voltage and a rise in ground voltage are shown in chart 1. Resistance values at the resistor 01 (2011) to the resistor 07 (2017), the resistor 11 (2021) to the resistor 17 (2027), the resistor 21 (2031) to the resistor 23 (2033), and the resistor 31 (2041) to the resistor 33 (2043) are all given as R, and consumption currents at the circuit 1 (2001) to the circuit 8 (2008) are all given as I, for simplicity. It is assumed that the net power supply voltage at a circuit n (n=1 to 8) is VDDn, and the net ground voltage is GNDn.

CHART 1

| | Power Supply Voltage Drop | | | Ground Voltage Rise | |
|---|---|---|---|---|---|
| | (A) | (B) | | (A) | (B) |
| VDD1 | 7.4 IR | 12 IR | GND1 | 7.5 IR | 13 IR |
| VDD2 | 7.5 IR | 13 IR | GND2 | 7.4 IR | 12 IR |
| VDD3 | 6.3 IR | 10 IR | GND3 | 6.6 IR | 11 IR |
| VDD4 | 6.6 IR | 11 IR | GND4 | 6.3 IR | 10 IR |
| VDD5 | 4.1 IR | 6 IR | GND5 | 4.9 IR | 7 IR |
| VDD6 | 4.9 IR | 7 IR | GND6 | 4.1 IR | 6 IR |
| VDD7 | 0 | 0 | GND7 | 2.9 IR | IR |
| VDD8 | 2.9 IR | IR | GND8 | 0 | 0 |

It can be confirmed in the chart 1 that the maximum values of the drop in power source potential at each part of a functional circuit are reduced by approximately 40%. That is, a stable power supply is performed in terms of the operation of the functional circuit. Moreover, in the case where a voltage is allowed to drop to the extent of the conventional example, the power supply wiring and the ground wiring can be thin by approximately 40% because a resistance as a whole is allowed to increase by approximately 40%. Therefore, the arrangement area for the power supply wiring and the ground wiring can be reduced by approximately 40%.

In this manner, in this embodiment mode, the power supply wiring and the ground wiring of the functional circuit in a semiconductor device and a display device are formed in a grid-like arrangement with the first wiring, the contact between the first wiring and the second wiring, and the second wiring. A drop in power supply voltage can be drastically decreased in a grid-like arrangement by comparison with the case where a grid-like arrangement is not employed. Moreover, the arrangement area for the power supply wiring and the ground wiring can be greatly reduced when the width of the wiring is thin because a drop in the power supply voltage and a rise in ground voltage can be suppressed to almost the same extent in the case where a grid-like arrangement is not employed. Therefore, a semiconductor device and a display device which are lightweight, thin, and high performance can be provided at a low cost.

Embodiment Mode 2

Figure 3:
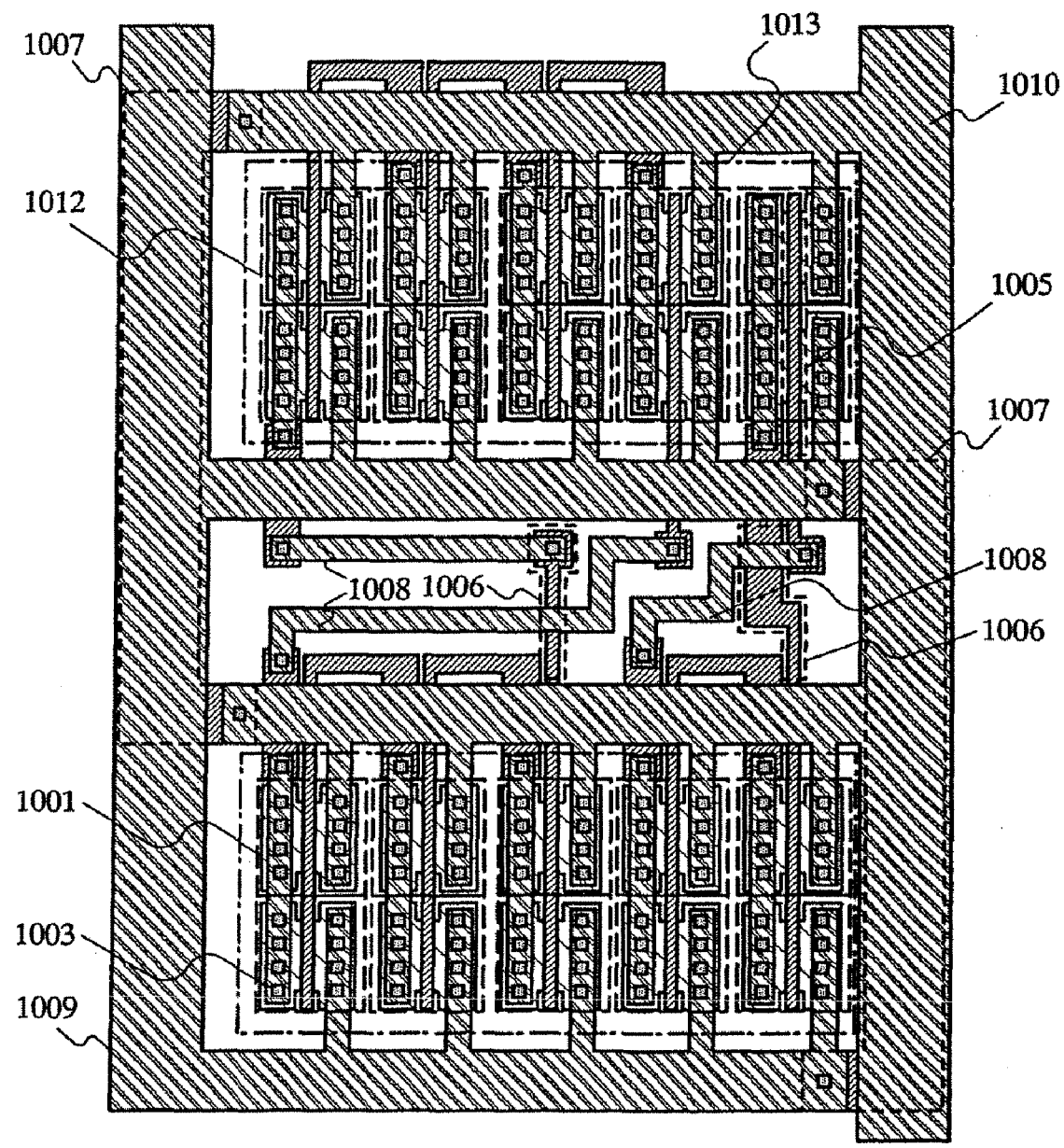
FIG. 3 is a mask layout of a functional circuit of a semiconductor device and a display device of the present invention.

In this embodiment mode, a mask layout of a functional circuit in a semiconductor device and a display device according to the present invention which is different from Embodiment Mode 1 is described. FIG. 3 shows a mask layout of this embodiment mode. It is to be noted that portions which are identical in FIG. 1 are denoted by the same reference symbols.

FIG. 3 shows the active layer 1001 which corresponds to a channel region, a source region, and a drain region of a TFT, the first wiring layer including the gate wiring 1005, the wiring 1006 between TFTs, and the first wiring 1007 which forms a power supply wiring or a ground wiring in a grid-like arrangement (hereinafter referred to as a first wiring for forming in a grid-like arrangement), the contact 1003 for connecting the first wiring and a second wiring or the active layer and the second wiring electrically, the second wiring layer including the wiring 1008 between TFTs, the power supply wiring 1009, the ground wiring 1010. The electric circuit 1013 is by using equal to or more than one TFT 1012.

Here, this embodiment mode is characterized in that the tips of the power supply wiring 1009 in a comb-like arrangement or the tips of the ground wiring 1010 in a comb-like arrangement are electrically connected respectively by using the contact 1003 and the first wiring for forming 1007 in a grid-like arrangement which overlaps the ground wiring 1010 or the power supply wiring 1009, without using the second wiring 1011 for forming in a grid-like arrangement of FIG. 1 described in Embodiment Mode 1. By such a configuration, an electrostatic capacitor can be formed between the power supply wiring 1009 and the ground wiring 1010. The electrostatic capacitor plays a role to suppress an absolute value of a momentary drop of power supply voltage. Therefore, it is preferable especially when a functional circuit operates at a high speed.

It is to be noted that a mask for an impurity dope and the like are required in an actual manufacturing process of TFTs, however, they are omitted for they are unessential in the invention.

The power supply wiring and the ground wiring in the functional circuit of this embodiment mode are electrically different from the power supply wiring and the ground wiring shown in Embodiment Mode 1 only in the respect of the connection of the tips of the wiring in a comb-like arrangement. Therefore, FIG. 2A is adopted as a typical equivalent circuit of the power supply wiring and the ground wiring. Also, the result in the chart 1 estimating a drop in the power supply voltage and a rise in the ground voltage can be adopted as they are, as for the net voltage applied to the circuit 1 (2001) to the circuit 8 (2008) in the equivalent circuit of FIG. 2A.

The largest drop in power source potential at each part of a functional circuit can be reduced by approximately 40% according to the method described in this embodiment mode. That is, a stable power supply is provided in terms of the operation of the functional circuit. Moreover, in the case where a voltage is allowed to drop to the extent of the conventional example, the widths of the power supply wiring and the ground wiring can be thin by approximately 40% because a resistance as a whole is allowed to increase by approximately 40%. Therefore, the arrangement area for the power supply wiring and the ground wiring can be reduced by approximately 40%.

In this manner, in this embodiment mode, the power supply wiring and ground wiring of a functional circuit in a semiconductor device and a display device are formed in a grid-like arrangement with the first wiring, a contact between the first wiring and the second wiring, and the second wiring. A drop in power supply voltage can be drastically decreased in a grid-like arrangement by comparison with the case where a grid-like arrangement is not employed. Moreover, the arrangement area for the power supply wiring and the ground wiring can be greatly reduced when the width of the wiring is thin because a drop in the power supply voltage and a rise in ground voltage can be suppressed to almost the same extent in the case where a grid-like arrangement is not employed. Further, an electrostatic capacitor can be easily formed between the power supply wiring and the ground wiring, which keeps a stable power source supply especially in the high speed operation. Therefore, a semiconductor device and a display device which are lightweight, thin, and has high performance can be provided at a low cost.

EMBODIMENT

Embodiment 1

In this embodiment as an example of a display device of the invention, a display device in which a CPU, an SRAM and the like are formed over the same substrate is explained.

Figure 4:
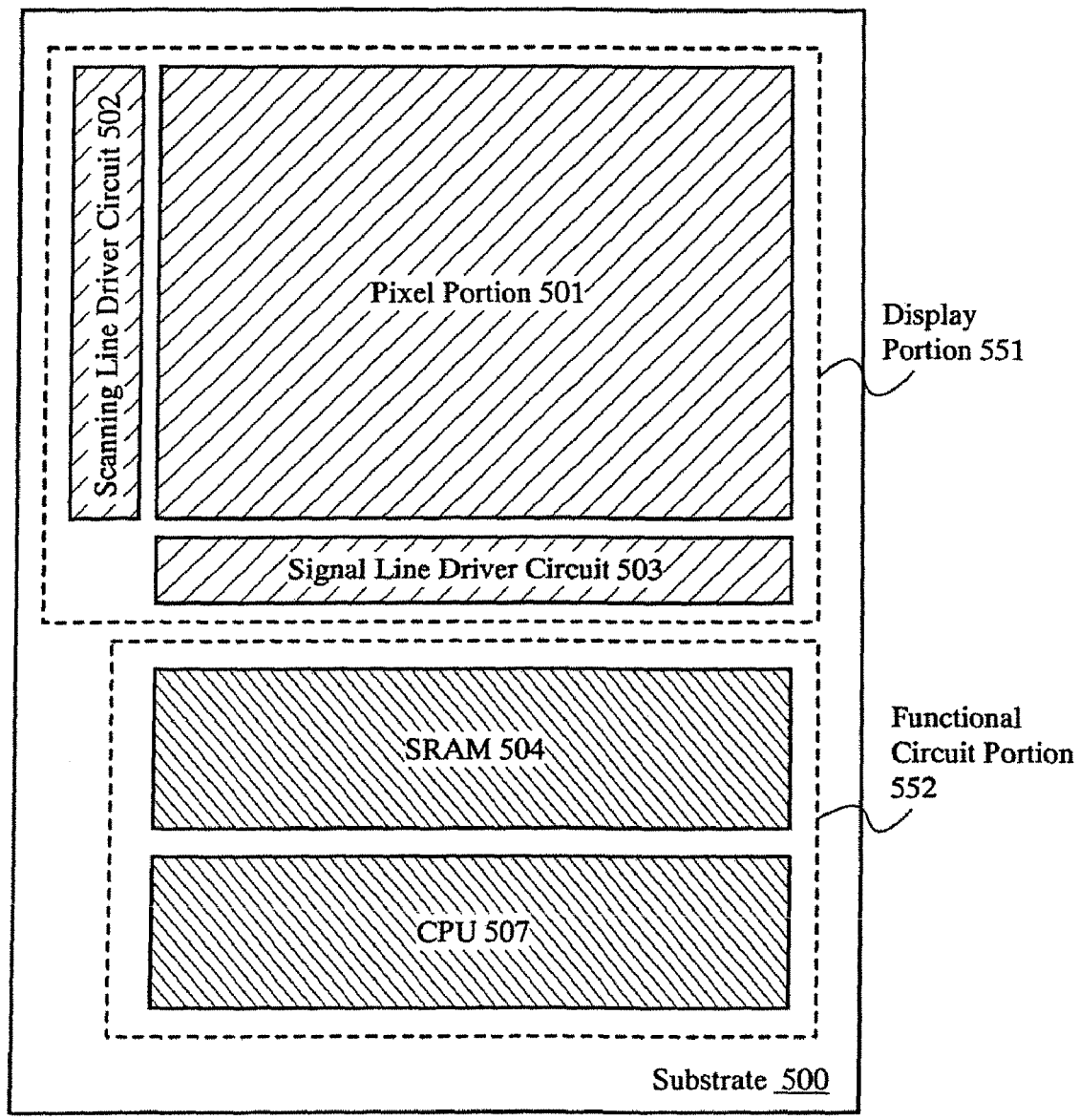
FIG. 4 is a top view of a display device of the present invention.

FIG. 4 shows a top view of a display device of the embodiment. The display device in FIG. 4 includes a display portion 551 and a functional circuit portion 552 which are formed by using TFTs formed over a substrate 500 having an insulating surface. The display portion 551 includes a pixel portion 501, a scanning line driver circuit 502, and a signal line driver circuit 503. Also, the functional circuit portion 552 includes a CPU 507 and an SRAM (memory circuit) 504. In the display portion 551, the pixel portion 501 displays an image. Further, the scanning line driver circuit 502 and the signal line driver circuit 503 control an input of a video signal to each pixel in the pixel portion 501. The SRAM 504 is formed by using a plurality of memory cells (not shown) arranged in matrix. One of the functions of each memory cell is to store the signal inputted and outputted at the CPU 507. Furthermore, one of the functions of the CPU 507 is to output a control signal to the scanning line driver circuit 502 and the signal line driver circuit 503.

Figure 5:
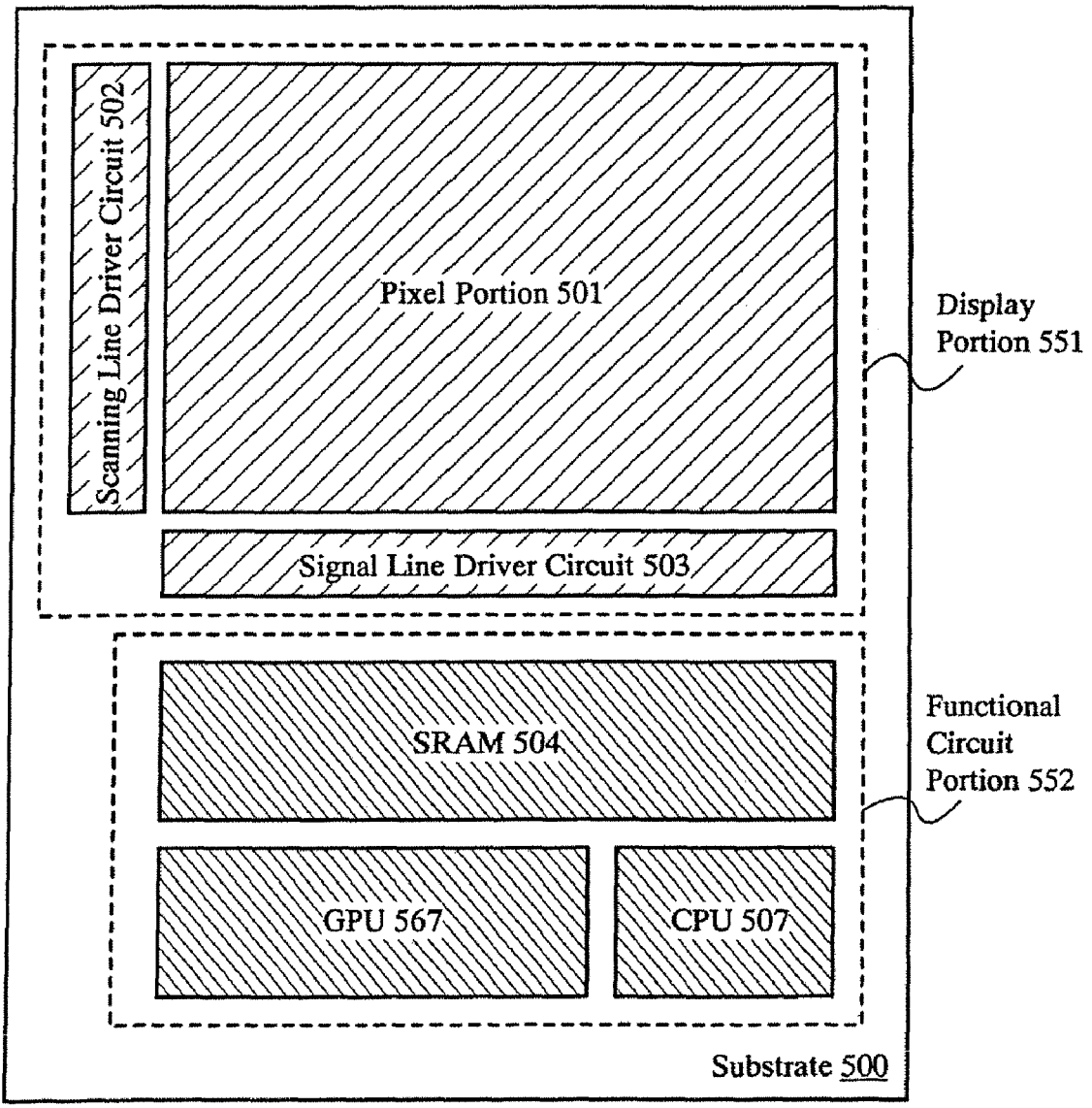
FIG. 5 is a top view of a display device of the present invention.

It is to be noted that the functional circuit portion 552 may include a GPU (video signal processing unit) 567. The structure thereof is shown in FIG. 5. Portions which are identical in FIG. 4 are denoted by the same reference symbols and explanations thereof are omitted. The GPU 567 changes a signal inputted from outside of the substrate 500 into a signal for inputting to the display portion 551.

In FIGS. 4 and 5, a liquid crystal display device or a display device using a self light-emitting element can be used for the display portion 551.

The functional circuit portion 552 is required to be small, low in power consumption, high in operation frequency and the like. Such an advanced functional circuit portion 552 requires a very complicated lead wiring between TFTs, which ends in occupying a large area over a substrate. For reducing the area for functional circuit as a whole, the arrangement area for the power supply wiring and the ground wiring is required as small as possible while supplying a stable power supply voltage or a ground voltage. Therefore, a method described in Embodiment Modes 1 or 2 is efficient. Because of this, a drop in power supply voltage of the functional circuit portion can be decreased drastically and a functional circuit suitable for high speed operation can be fabricated. Furthermore, the arrangement area for the power supply wiring and the ground wiring can be greatly reduced, which makes it possible to provide a display device which is lightweight, thin and low in cost.

It is to be noted that the invention can be freely combined with Embodiment Modes 1 or 2.

Embodiment 2

Figure 6A:
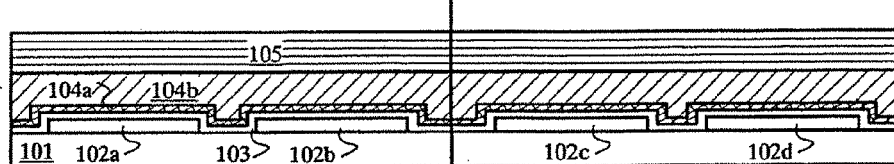
FIGS. 6A to 6H are diagrams showing methods of fabricating TFTs of a display device of the present invention.

In this embodiment, one example of a method of manufacturing a TFT in a display device in which the functional circuit described in Embodiment 1 is formed over the same substrate is described with reference to FIGS. 6A to 6H. It is to be noted that a method for manufacturing a TFT in a functional circuit portion can be applied to a method for manufacturing a semiconductor device of the invention as it is. In FIG. 6A, a substrate in which an insulating film is formed on the surface of a quartz substrate, a silicon substrate, a metal substrate or a stainless substrate is used for a substrate 101. Moreover, a plastic substrate having a heat resistance capable of resisting the treatment temperature of the present manufacturing process may be used. The substrate 101 made of barium borosilicate glass, alumino borosilicate glass or the like is used in this embodiment.

Subsequently, a base film (not shown) made of an insulating film such as a silicon oxide film, a silicon nitride film, a silicon oxynitride film or the like is formed over the substrate 101. The base film may be formed in either a monolayer structure made of the above-described insulating film or a structure in which two layers or more of the above-described insulating films are laminated.

Subsequently, as a first layer of the base film, a silicon nitride oxide film which is formed using a plasma CVD method by utilizing $SiH_4$, $NH_3$ and $N_2O$ as reaction gases is formed in a film thickness of from 10 nm to 200 nm (preferably, from 50 nm to 100 nm). In this embodiment, the silicon nitride oxide film is formed in a film thickness of 50 nm. Subsequently, as a second layer of the base film, a silicon oxynitride film which is formed using a plasma CVD method by utilizing $SiH_4$ and $N_2O$ as reaction gases is formed in a film thickness of from 50 nm to 200 nm (preferably, from 100 nm to 150 nm). In this embodiment, the silicon oxynitride film is formed in a film thickness of 100 nm.

Subsequently, a semiconductor film is formed over the base film. The semiconductor film is formed in a film thickness of from 25 nm to 80 nm (preferably, from 30 nm to 60 nm) by a known means (sputtering method, LPCVD method, plasma CVD method or the like). Secondly, the above-described semiconductor film is crystallized using a known crystallization method (laser crystallization method, thermal crystallization method by utilizing rapid thermal annealing (hereinafter, referred to as RTA method) or furnace-annealing, thermal crystallization method using a metal element for promoting the crystallization or the like). It is to be noted that the thermal crystallization method using a metal element for promoting the crystallization and the laser crystallization method may be combined. For example, after the thermal crystallization method using a metal element for promoting the crystallization has been carried out, the laser crystallization method may be carried out.

Then, semiconductor layers (semiconductor active layers) 102a to 102d are formed by performing the patterning of the obtained crystalline semiconductor film into the desired shape. It is to be noted that as the above-described semiconductor layer, a compound semiconductor film or the like having an amorphous semiconductor film, a micro crystalline semiconductor film, a crystalline semiconductor film, or an amorphous structure such as an amorphous silicon germanium film or the like can be used.

In this embodiment, an amorphous silicon film is formed in a film thickness of 55 nm using a plasma CVD method. Then, a solution containing nickel is retained on the amorphous silicon film, and after this amorphous silicon film is dehydrogenized (at 500° C. for one hour), the crystalline silicon film is formed by performing the thermal crystallization (at 550° C. for 4 hours). Subsequently, the semiconductor layers 102a to 102d are formed in an island shape by performing the patterning treatment using a photolithography.

It is to be noted that in the case where a crystalline semiconductor film is formed by a laser crystallization method, a gas laser or a solid-state laser of a continuous wave or pulsed laser may be employed. As the former gas laser, an excimer laser, a YAG laser, a $YVO_4$ laser, a YLF laser, a $YAlO_3$ laser, a glass laser, a ruby laser, a Ti: sapphire laser or the like can be employed. Moreover, as the latter solid-state laser, a laser using a crystal such as a YAG, a $YVO_4$, a YLF, a $YAO_3$ or the like into which Cr, Nd, Er, Ho, Ce, Co, Ti or Tm is doped can be employed. The fundamental waves of the above lasers are different depending upon the material in which an element is doped, and a laser beam having around 1 μm in fundamental wavelength is obtained. A higher harmonic wave with respect to the fundamental wave can be obtained by utilizing a non-linear optical element. It is to be noted that upon the crystallization of an amorphous semiconductor, the second harmonic wave to the fourth harmonic wave of the fundamental wave is preferably applied using a solid-state laser capable of performing the continuous oscillation in order to obtain a crystal having a large particle diameter. Representatively, the second harmonic wave (532 nm) or the third harmonic wave (355 nm) of a Nd:$YVO_4$ laser (fundamental wave; 1064 nm) is applied.

Moreover, a laser beam emitted from a continuous wave $YVO_4$ laser of output 10 W is converted into a higher harmonic wave by a non-linear optical element. Furthermore, there is another method in which a $YVO_4$ crystal and a non-linear optical element are put in a resonator and a higher harmonic wave is emitted. Then, a laser beam is preferably formed into a rectangular shape or an elliptical shape on an irradiated surface by an optical system, and irradiated to the processing object. At this time, the energy density is required to be in the range from about 0.01 $MW/cm^2$ to 100 $MW/cm^2$ (preferably, in the range from 0.1 $MW/cm^2$ to 10 $MW/cm^2$). Then, a semiconductor film is moved relative to the laser beam at the rate in the range from about 10 cm/sec to 2000 cm/sec and irradiated.

Moreover, in the case where the above-described laser is used, a laser beam emitted from a laser oscillator is preferably condensed in a linear shape by an optical system, thereby being irradiated to the semiconductor film. Although the conditions for crystallization is appropriately set, in the case where the excimer laser is used, the pulse oscillation frequency may be set at 300 Hz, and a laser energy density may be set in the range from 100 $mJ/cm^2$ to 700 $mJ/cm^2$ (representatively, in the range from 200 $mJ/cm^2$ to 300 $mJ/cm^2$). Moreover, in the case where a YAG laser is used, the pulse oscillation frequency may be set in the range from 1 Hz to 300 Hz using its second harmonic wave, and the laser energy density may be set in the range from 300 $mJ/cm^2$ to 1000 $mJ/cm^2$ (representatively, from 350 $mJ/cm^2$ to 500 $mJ/cm^2$). Then, the laser beam condensed in a linear shape in the range from 100 μm to 1000 μm in width (preferably, 400 μm in width) is irradiated on the whole surface of the substrate. An overlapping rate of the linear beam at this time may be set in the range from 50% to 98%.

In this embodiment, however, since the crystallization of the amorphous silicon film has been carried out using a metal element for promoting the crystallization, the metal element remains in the crystalline silicon film. Therefore, an amorphous silicon film having a film thickness in the range from 50 nm to 100 nm is formed on the crystalline silicon film, the metal element is diffused into the amorphous silicon film by performing the heating treatment (RTA method or thermal annealing using furnace-annealing or the like), the amorphous silicon film is removed by etching after the heating treatment. As a result, the metal element contained in the crystalline silicon film can be reduced or removed.

It is to be noted that after the semiconductor layers 102*a* to 102*d* in the island shape have been formed, a trace of an impurity element (boron or phosphorus) may be doped. Thus, a trace of an impurity element is also added to a region which is to be a channel region, and then the threshold value of TFT can be controlled.

Subsequently, a gate insulating film 103 for covering the semiconductor layers 102*a* to 102*d* is formed. The gate insulating film 103 is formed of an insulating film containing silicon in a film thickness of from 40 nm to 150 nm by utilizing a plasma CVD method or a sputtering method. In this embodiment, a silicon oxynitride film is formed in a film thickness of 115 nm as the gate insulating film 103 by a plasma CVD method. Needless to say, the gate insulating film 103 is not limited to the silicon oxynitride film, another insulating film containing silicon may be used as a monolayer structure or a laminated structure. It is to be noted that in the case where a silicon oxide film is used as the gate insulating film 103, the gate insulating film may be formed using electrically discharging by a plasma CVD method under the conditions of using the mixture gas of TEOS (tetraethyl orthosilicate) and $O_2$, the reaction pressure at 40 Pa, the substrate temperature in the range from 300° C. to 400° C., high frequency (13.56 MHz) and power density in the range from 0.5 W/cm$^2$ to 0.8 W/cm$^2$. The silicon oxide film formed by the above-described process can obtain an excellent property as the gate insulating film 103 by subsequent thermal annealing at the temperature in the range from 400° C. to 500° C.

Here, an impurity element might have been previously doped into the specific regions of the semiconductor layers 102*a* to 102*d* before a gate wiring is formed. A $L_{ov}$ region or the like can be formed by forming the gate wiring to be overlapped with the impurity region formed at this time. It is to be noted that another insulating film (referred to as insulating film for doping) different from the gate insulating film 103 may be previously formed when an impurity element is doped into the semiconductor layers 102*a* to 102*d*. In this case, after the above-described doping treatment has been terminated, the insulating film for doping is removed.

Subsequently, a first conductive film 104*a* is formed from tantalum nitride (TaN) in a film thickness of 20 nm to 100 nm, and a second conductive film 104*b* is formed from tungsten (W) in a film thickness of 100 nm to 400 nm. Thus, a first wiring layer having a two-layer laminated structure is formed. In this embodiment, the first conductive film 104*a* formed from tantalum nitride (TaN) in a film thickness of 30 nm and the second conductive film 104*b* formed from tungsten (W) in a film thickness of 370 nm are laminated.

In this embodiment, the tantalum nitride (TaN) film which is the first conductive film 104*a* is formed in the atmosphere containing nitrogen by a sputtering method using the target of tantalum (Ta). Moreover, the tungsten (W) film which is the second conductive film 104*b* is formed by a sputtering method using the target of tungsten (W). Besides these, it can be also formed by a thermal CVD method using tungsten hexafluoride (WF$_6$). In any case, in order to use it as a gate wiring, the resistivity is required to be lowered, and the resistivity of the tungsten (W) film is preferably made 20 μΩcm or less. Although the resistivity of the tungsten (W) film can be lowered by enlarging crystal grains thereof, in the case where the amount of an impurity element such as oxygen or the like is much in the tungsten (W) film, the crystallization is inhibited and the resistivity becomes higher. Therefore, in this embodiment, the tungsten (W) film having the resistivity in the range from 9 μΩcm to 20 μΩcm is realized by a sputtering method using the target of tungsten (W) at a high purity (purity; 99.9999%), and further by forming the tungsten (W) film while taking a sufficient consideration in order not to mix an impurity from the vapor phase during the film formation.

It is to be noted that the first conductive film 104*a* is formed of tantalum nitride (TaN) film, the second conductive film 104*b* is formed of tungsten (W) film, but materials for constituting the first conductive film 104*a* and the second conductive film 104*b* are not particularly limited. The first conductive film 104*a* and the second conductive film 104*b* may be formed from an element selected from tantalum (Ta), tungsten (W), titanium (Ti), molybdenum (Mo), aluminum (Al), copper (Cu), chromium (Cr) and neodymium (Nd), or an alloy material or a compound material mainly comprising the foregoing element. Moreover, it may be also formed of a semiconductor film represented by a polycrystalline silicon film in which an impurity element such as phosphorus or the like are doped or Ag—Pd—Cu alloy.

It is to be noted that a conductive film formed of the first conductive film 104*a* and the second conductive film 104*b* corresponds to the first wiring layer described in Embodiment Modes 1 and 2.

Next, a resist 105 is formed. As a method of forming the resist 105, a coating method can be employed. It is to be noted that as a coating method, a spin coater or a roll coater may be used. As for the resist 105, either of positive-type or negative-type can be used and selected according to the light source used at the time of exposure.

Figure 6B:
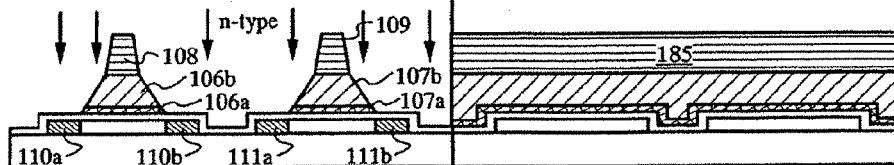

Subsequently, as shown in FIG. 6B, the resist masks 108, 109 and 185 are formed by exposing the resist 105 to light (first exposure) and the first etching treatment (first wiring layer etching 1) is carried out for the purpose of forming a gate wiring. In this embodiment, using the gas mixed with CF$_4$ and Cl$_2$ as etching gas, ICP (Inductively Coupled Plasma) etching as a procedure of etching of the first etching treatment is performed by generating a plasma by providing the RF power (13.56 MHz) of 500 W into a coil type electrode at a pressure of 1 Pa. RF power (13.56 MHz) of 100 W is provided and a negative self-biasing voltage is substantially applied on the substrate side (a sample stage). In the case where a mixed gas of CF$_4$ and Cl$_2$ is used, both W film and TaN film are etched to the same extent.

The portions of the first conductive film 104*a* and the second conductive film 104*b* formed on the semiconductor layers 102*c* and 102*d* are not etched because these films are covered with the resist mask 185.

Under the above-described etching conditions, by making the shape of the resist mask suitable, the edge portions of the first conductive layers 106*a* and 107*a*, and those of the second conductive layers 106*b* and 107*b* are made in a tapered shape by the effect of bias voltage applied on the substrate side. Here, an angle (taper angle) of the portion having a tapered shape (tapered portion) is defined as an angle formed between the surface of the substrate 101 (horizontal surface) and the tilted portion of the tapered portion. The angle of the tapered portion of the first conductive layer and the second conductive layer can be made at an angle in the range from 15° to 45° by appropriately selecting the etching conditions. In order to etch without remaining the residue on the gate insulating film 103, the etching time is preferably increased by the ratio of about 10% to 20%. Since the selection ratio of a silicon oxynitride film with respect to a tungsten (W) film is in the range from 2 to 4 (typically, 3), the surface in which the silicon oxynitride film has been exposed to is to be etched by about 20 nm to 50 nm by means of an over etching treatment. Thus, the conductive layers 106 and 107 (first conductive layers 106a and 107a and second conductive layers 106b and 107b) of the first shape are formed by performing the first etching treatment. At this time, in the gate insulating film 103, the exposed region is etched by about 20 to 50 nm, and the thinned regions are formed.

Then, an impurity element for giving N type is added by performing the first doping treatment (doping 1). As for the doping method, it may be performed by an ion doping method, or an ion implantation method. As for the conditions for an ion doping method, the dosage is set in the range from $1\times10^{13}$ atoms/cm$^2$ to $5\times10^{14}$ atoms/cm$^2$, the acceleration voltage is set in the range from 60 kV to 100 kV. As an impurity element which gives the N-type impurity, an element belonging to 15 group, typically, phosphorus (P) or arsenic (As) are employed. Phosphorus (P) is employed in this embodiment. In this case, first impurity regions 110a, 110b, 111a and 111b are formed in a self-aligned manner by utilizing the conductive layers 106 and 107 of the first shape (first conductive layers 106a and 107a and second conductive layers 106b and 107b) as masks for adding an impurity element for giving N type. An impurity element for giving N type is added to the first impurity regions 110a, 110b, 111a and 111b in the range of density from $1\times10^{20}$ atoms/cm to $1\times10^{21}$ atoms/cm$^3$.

Figure 6C:
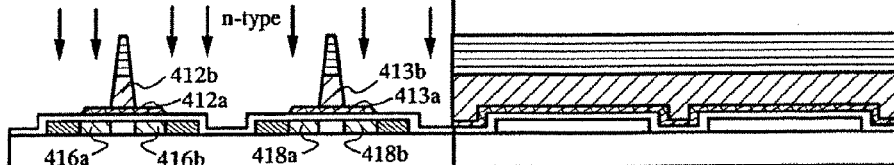

Next, as shown in FIG. 6C, the resist mask is not removed and the second etching treatment (first wiring layer etching 2) is carried out. $CF_4$, $Cl_2$ and $O_2$ are used for etching gases, the tungsten (W) film is selectively etched. Thus, the conductive layers 412 and 413 of the second shape (first conductive layers 412a and 413a, and second conductive layers 412b and 413b) are formed by the second etching treatment. At this time, in the gate insulating film 103, the exposed region is further etched by about 20 nm to 50 nm, and becomes thin.

The etching reaction of tungsten (W) film and tantalum nitride (TaN) film using the mixed gas of $CF_4$ and $Cl_2$ can be estimated from the generated radical or ion species and the vapor pressure of the reaction products. When the vapor pressures of fluoride and chloride of tungsten (W) and tantalum (Ta) are compared, the vapor pressure of $WF_6$ which is a fluoride of tungsten (W) is extremely high, and those of other $WCl_5$, $TaF_5$, $TaCl_5$ are at similar level. Therefore, both of the tungsten (W) film and tantalum nitride (TaN) film are etched by the mixed gas of $CF_4$ and $Cl_2$. However, when an appropriate amount of $O_2$ is added to this mixed gas, $CF_4$ and $O_2$ are reacted into CO and F, a large amount of F radical or F ion are generated. As a result, in the case of the tungsten (W) film whose vapor pressure of fluoride is high, its etching rate is increased. On the other hand, in the case of tantalum (Ta), if F is increased, the relative increase of the etching rate is small. Moreover, since tantalum (Ta) is easily oxidized compared to tungsten (W), the surface of tantalum (Ta) is oxidized by adding $O_2$. Since the oxide of tantalum (Ta) is not reacted with fluorine and chlorine, the etching rate of tantalum (Ta) film is further lowered. Therefore, the difference between the etching rates of tungsten (W) film and tantalum (Ta) film can be made, the etching rate of tungsten (W) film can be more increased comparing to the etching rate of tantalum (Ta) film.

Then, the second doping treatment (doping 2) is carried out. In this case, the dosage is lowered more than that of the first doping treatment, and an impurity element for giving N type, phosphorus in this embodiment, is doped under the condition of a high acceleration voltage. For example, under the condition of the acceleration voltage being set at 70 kV to 120 kV, the doping is performed at the dosage of $1\times10^{13}$ atoms/cm$^2$, and a new impurity region is formed inside of the first impurity regions 110a, 110b, 111a and 111b formed on the island shape semiconductor layer of FIG. 6B. The doping is carried out using the second conductive layers 412b, 413b as masks for adding an impurity element so that the impurity element is also added to the semiconductor layers in the regions below the first conductive layers 412a and 413a. Thus, the second impurity regions 416a, 416b, 418a and 418b are formed. The concentration of phosphorus (P) added to these second impurity regions 416a, 416b, 418a and 418b has a gentle concentration gradient according to the film thickness of the tapered portions of the first conductive layers 412a and 413a. It is to be noted that although the impurity concentration is slightly lowered from the edge portion of the tapered portions of the first conductive layers 412a and 413a toward the inside in the semiconductor layer overlapped with the tapered portions of the first conductive layers 412a and 413a, the concentration is approximately the same.

Figure 6D:
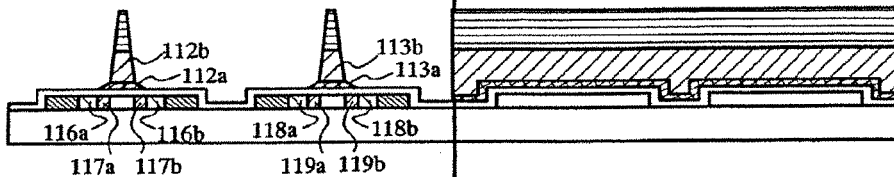

Subsequently, as shown in FIG. 6D, the third etching treatment (first wiring layer etching 3) is carried out. The etching treatment is carried out using $CHF_6$ as an etching gas by utilizing a reactive ion etching method (RIE method). The region in which the first conductive layer and the semiconductor layer are overlapped is diminished by partially etching the tapered portions of the first conductive layers 412a and 413a by means of the third etching treatment. The conductive layers 112 and 113 of the third shape (first conductive layers 112a and 113a and second conductive layers 112b and 113b) are formed by means of the third etching treatment. At this time, in the gate insulating film 103, the exposed region is further etched by about 20 nm to 50 nm and becomes thin. The second impurity regions 117a, 117b, 119a and 119b which are overlapped with first conductive layers 112a and 113a and the third impurity regions 116a, 116b, 118a and 118b which are located between the first impurity regions and the second impurity regions are formed from the second impurity regions 416a, 416b, 418a and 418b.

Figure 6E:
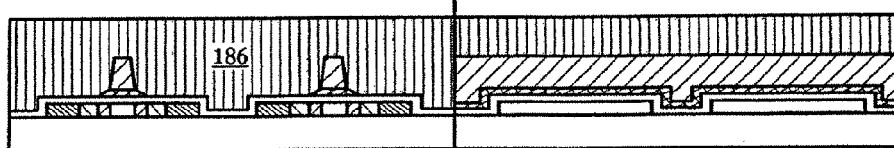

Subsequently, as shown in FIG. 6E, after the resist masks 108, 109 and 185 have been removed, a resist 186 is newly formed as a film. As the film forming method of the resist 186, a coating method can be employed. It is to be noted that a spin coater or a roll coater may be used as a coating method. As for the resist 186, either of a positive-type or a negative-type can be used and selected according to the light source used at the time of exposure. It is to be noted that the material for the resist 186 may be identical with that of the resist 105 used at the time of the first exposure, or may be different from that.

Figure 6F:
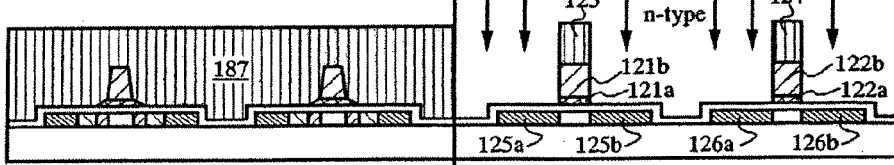

Subsequently, the resist 186 is exposed to light (second exposure) thereby forming resist masks 123, 124 and 187 (FIG. 6F). It is to be noted that exposure means used in the second exposure may be the same as that of the first exposure, or may be different from that. Subsequently, the fourth etching treatment (first wiring layer etching 4) is carried out. Thus, conductive layers 121 and 122 of the fourth shape (first conductive layers 121a and 122a, and second conductive layers 121b and 122b) having an approximately vertical edge portions are formed. It is to be noted that since the portions of the conductive layers 112 and 113 of the third shape (first conductive layers 112a and 113a and second conductive layers 112b and 113b) formed over the semiconductor layers 102a and 102b are covered with the resist mask 187, these are not etched.

Subsequently, the third doping treatment (doping 3) is carried out. In the third doping treatment, an impurity element for giving N type is added. A doping method may be carried out by an ion doping method, or an ion implantation method. As the conditions of an ion doping method, the dosage is set in the range from $1\times10^{13}$ atoms/cm$^2$ to $5\times10^{14}$ atoms/cm$^2$, and the acceleration voltage is set in the range from 60 kV to 100 kV. An element belonging to 15 group, typically, phosphorus (P) or arsenic (As) is used as an impurity element for giving N type. Phosphorus (P) is used in this embodiment. In this case, fourth impurity regions 125a, 125b, 126a and 126b are formed by utilizing the resist masks 123, 124 and 187 as masks for adding the impurity element for giving N type. An impurity element for giving N type is added to the fourth impurity regions 125a, 125b, 126a and 126b in the concentration range from $1\times10^{20}$ atoms/cm$^3$ to $1\times10^{21}$ atoms/cm$^3$. It is to be noted that since the semiconductor layers 102a and 102b are covered with the resist mask 187, an impurity element is not added by the third doping treatment.

In this embodiment, the conditions of the doping of an impurity element (third doping treatment) applied to the fourth impurity regions 125a, 125b, 126a and 126b are made as the same as the conditions of the doping of an impurity element applied to the first impurity regions 110a, 110b, 111a and 111b (first doping treatment). However, the condition is not limited to this. The conditions may be different in the first doping treatment and the third doping treatment.

Figure 6G:
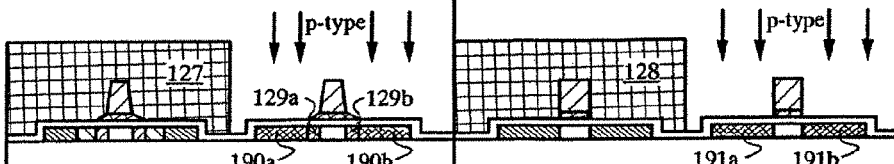

Subsequently, as shown in FIG. 6G, after the resist masks 187, 123 and 124 are removed, resist masks 127 and 128 are newly formed, and the fourth doping treatment (doping 4) is carried out. In the fourth doping treatment, an impurity element for giving N type is added. As for a doping method, an ion doping method or an ion implantation method may be employed. In the island shape semiconductor layers 102b and 102d for forming a P-channel type TFT, the fourth impurity regions 190a, 190b, 191a, 191b, 129a and 129b to which a P-type impurity element is added are formed. At this time, the impurity region is formed in a self-aligned manner by utilizing the conductive layer of the third shape 113b and the conductive layer of the fourth shape 122 as masks for the impurity element. It is to be noted that the island shape semiconductor layers 102a and 102c for forming an N-channel type TFT is previously covered with the resist masks 127 and 128 entirely.

Phosphorus (P) is added in the respective different concentrations to the fourth impurity regions 190a, 190b, 191a, 191b, 129a and 129b by performing the first doping treatment, the second doping treatment and the third doping treatment. However, an impurity element for giving p type is added to any of the regions by an ion doping method using diboron hexahydrate (diborane) ($B_2H_6$). At this time, it is made so that the concentration of an impurity element for giving p type in the fourth impurity regions 190a, 190b, 191a and 191b is in a concentration range from $2\times10^{20}$ atoms/cm$^2$ to $2\times10^{21}$ atoms/cm$^2$. Thus, the fourth impurity regions 190a, 190b, 191a and 191b function as the source region and the drain region of the P-channel type TFT without any problem. Moreover, the fourth impurity regions 129a and 129b function as the $L_{ov}$ region of the P-channel type TFT without any problem.

By means of the above-described process, impurity regions are formed in the respective semiconductor layers 102a to 102d. The conductive layers of the third shape 112 and 113 and the conductive layers of the fourth shape 121 and 122 overlapped with the island shape semiconductor layer function as gate wiring.

It is to be noted that the wiring between TFTs and the first wiring in a grid-like arrangement described in the Embodiment Modes 1 and 2 may be formed in the same way as any one of the conductive layers of the third shape 112 and 113, the conductive layers of the fourth shape 121 and 122.

Figure 6H:
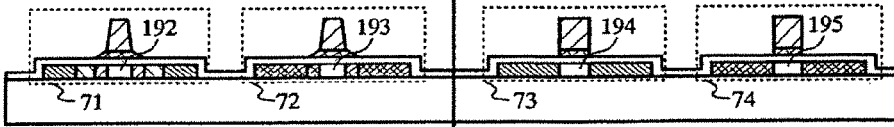

Thus, as shown in FIG. 6H, an N-channel type TFT 71, a P-channel type TFT 72, an N-channel type TFT 73 and a P-channel type TFT 74 are formed.

The N-channel type TFT 71 includes a channel region 192, high concentration impurity regions 110a and 110b corresponding to a source region and a drain region, low concentration impurity regions ($L_{ov}$ regions) 117a and 117b which are overlapped with the gate wiring, low concentration impurity regions ($L_{ov}$ regions) 116a and 116b which are not overlapped with the gate wiring. On the other hand, the P-channel type TFT 72 includes a channel region 193, a high concentration impurity regions 190a and 190b corresponding to a source region and a drain region, and low concentration impurity regions ($L_{ov}$ regions) 129a and 129b which are overlapped with the gate wiring. It is to be noted that it is formed in such a structure that it does not have the $L_{off}$ regions. The gate wirings of the N-channel type TFT 71 and the P-channel type TFT 72 have an edge portion in a tapered shape. Therefore, these are TFTs in a shape which is not suitable in order to make the gate wiring smaller. However, since the $L_{ov}$ regions and the $L_{off}$ regions can be formed in a self-aligned manner in the gate wiring manufacturing step, the number of the step in the TFT manufacturing can be suppressed. Thus, a TFT having a high withstanding voltage while the number of the steps is reduced can be formed.

Moreover, the N-channel type TFT 73 includes a channel region 194 and a high concentration impurity regions 125a and 125b corresponding to a source region and a drain region. Moreover, the P-channel type TFT 74 has a channel region 195 and high concentration impurity regions 191a and 191b corresponding to a source region and a drain region. The N-channel type TFT 73 and the P-channel type TFT 74 are formed in a signal drain structure. In the case where the N-channel type TFT 73 and P-channel type TFT 74 are made TFTs having the $L_{ov}$ regions and the $L_{off}$ regions, there are problems that a new mask is required and the number of the step is increased. However, since the edge portions of the gate wiring are etched in the vertical direction, the refining can be carried out.

For example, a circuit in which the withstanding voltage is required such as a display portion can be applied with the N-channel type TFT 71 and the P-channel type TFT 72, and a circuit in which the refining is required such as a functional circuit portion can be applied with the N-channel type TFT 73 and the P-channel type TFT 74.

It is to be noted that the exposure means used in the step of performing the first exposure and the exposure means used in the step of performing the second exposure can be made the same, or can be different from each other. Here, in general, as the wavelength of the radiation energy source used for exposure is shorter, the resolution at the time of exposure becomes higher. Hence, for example, in the case where the N-channel type TFT 73 and the P-channel type TFT 74 are required to be refined rather than the N-channel type TFT 71 and the P-channel type TFT 72, the wavelength of light used in the step of performing the second exposure is made shorter than the wavelength of light used in the step of the first exposure.

Moreover, an exposure apparatus used in the step of performing the first exposure and an exposure apparatus used in the step of performing the second exposure can be made the same or can be made different from each other.

For example, in the case where the N-channel type TFT 73 and the P-channel type TFT 74 are required to be refined rather than the N-channel type TFT 71 and the P-channel type TFT 72, the exposure is carried out using an exposure apparatus using a mirror projection method (hereinafter referred to as a MPA) in the step of performing the first exposure, and the exposure is carried out using a reduction image projection exposure apparatus (commonly known as a stepper) in the step of performing the second exposure. Here, in general, in the case where a MPA is used, since a large area can be exposed once, it is advantageous in the productivity of semiconductor devices. On the other hand, in the case where a stepper is used, the resist is exposed to light by projecting the pattern on a reticle by an optical system and operating and stopping (step and repeat) the stage on the substrate side. Comparing to the MPA, although a large area cannot be exposed once, the resolution of line and space (L&S) (hereinafter, a resolution is referred to as a resolution of L&S) can be enhanced.

Moreover, as another example, in the case where the N-channel type TFT 73 and the P-channel type TFT 74 are required to be refined rather than the N-channel type TFT 71 and the P-channel type TFT 72, in the step of performing the first exposure, a stepper whose reduction ratio is small at the time when the pattern on the reticle is projected on the resist by an optical system is used, and in the step of performing the second exposure, a stepper whose reduction ratio is large at the time when the pattern on the reticle is projected on the resist by an optical system is used. It is to be noted that the reduction ratio of a stepper is a value indicating N(N is an integer) at the time when the pattern on the reticle is projected on the resist by making it 1/N-fold. Here, in general, in the case of a stepper whose reduction ratio is large at the time when the pattern on the reticle is projected on the resist by an optical system, the area in which the exposure can be carried out once is narrow, but the resolution is high. On the other hand, in the case of a stepper whose reduction ratio is small at the time when the pattern on the reticle is projected on the resist by an optical system, the area in which the exposure can be carried out once is wide, but the resolution is low.

As described above, a semiconductor device having a high productivity and TFT having an excellent property can be fabricated by changing the exposure means in the steps of performing the first exposure and the second exposure. It is to be noted that the exposure means (that indicates both of exposure conditions and exposure apparatus) used in the steps of performing the first exposure and the second exposure is not limited to the above-described one. Known exposure means can be freely used. Moreover, the steps of performing the first exposure and the second exposure may be carried out by utilizing a plurality of exposure means, respectively.

It is to be noted that although in this embodiment, the step of fabricating a single gate type TFT has been described, a double gate structure, a multi-gate structure having the number of gates more than two would be also available.

It is to be noted that in this embodiment, a top gate type TFT has been shown, and the steps of fabricating it has been described. However, a method of fabricating a semiconductor device of the embodiment can be also applied to a dual gate type TFT. It is to be noted that a dual gate type TFT is referred to as a TFT having a gate wiring superimposed above a channel region via an insulating film and a gate wiring superimposed below the relevant channel region via an insulating film.

Moreover, the degree of freedom for the shape of an electrode of an element except for TFT, wirings and the like formed with the first wiring layer can be increased if a method described in this embodiment is applied.

Embodiment 3

In this embodiment, an example of fabricating a liquid crystal display device is described as an example of a display device described in Embodiment 1 in which a functional circuit is mounted on the same substrate. It is to be noted that a configuration of a display portion and a functional circuit and TFTs used for them can be identical to Embodiments 1 and 2.

FIGS. 7A to 7C show sectional views of a display device of the embodiment. An N-channel type TFT 361 is shown to represent pixel TFTs which configure a pixel portion. Moreover, an N-channel type TFT 362 and a P-channel type TFT 363 are shown to represent elements which configure a pixel driver circuit portion. An N-channel type TFT 364 and a P-channel type TFT 365 are shown to represent elements which configure a functional circuit portion. The fabricating methods of the N-channel type TFTs 361 and 362, the P-channel type TFT 363, the N-channel type TFT 364 and the P-channel type TFT 365 are not described here as they are the same as the fabricating method described in FIG. 6 in the Embodiment 1. That is, the N-channel type TFTs 71, the P-channel type TFT 72, the N-channel type TFT 73, and the P-channel type TFT 74 can be applied to the N-channel type TFTs 361 and 362, the P-channel type TFT 363, the N-channel type TFT 364, and the P-channel type TFT 365 in FIG. 7 respectively.

As shown in FIG. 7A, a first interlayer insulating film 6036 is formed. The first interlayer insulating film 6036 is formed with an insulating film containing silicon in a film thickness of 100 to 200 nm by utilizing a plasma CVD method or a sputtering method. In this embodiment, a silicon oxynitride film is formed in a film thickness of 100 nm by a plasma CVD method. Needless to say, the first interlayer insulating film 6036 is not limited to the silicon oxynitride film, an insulating film containing other silicon may be used as a monolayer structure or a laminated structure.

Recrystallization of a semiconductor layer and an activation of the impurity element which is added to the semiconductor layer are performed by thermal treatment. This thermal treatment is conducted by thermal annealing using furnace-annealing. As for the thermal annealing, it is conducted at the temperature ranging from 400 to 700° C. in the nitrogen atmosphere containing 1 ppm or less of, preferably 0.1 ppm or less of oxygen, it is performed at 410° C. for one hour in this embodiment. It is to be noted that laser annealing or rapid thermal annealing (RTA) can be employed besides thermal annealing. Furthermore, the thermal treatment may be conducted before the first interlayer insulating film 6036 is formed. However, in the case where gate wirings of the N-channel type TFTs 361 and 362, the P-channel type TFT 363, the N-channel type TFT 364 and the P-channel type TFT 365 are sensitive to heat, it is preferable to perform the thermal treatment after the first interlayer insulating film 6036 (insulating film having silicon as its main constituent, for example a silicon nitride film) is formed to protect the wirings or the like as in this embodiment.

As described above, when the thermal treatment is conducted after the formation of the first interlayer insulating film 6036 (insulating film having silicon as its main constituent, for example a silicon nitride film), the hydrogenation of the semiconductor layer can also be conducted simultaneously with the activation. In the hydrogenation step, a dangling bond of the semiconductor layer is terminated by hydrogen contained in the first interlayer insulating film 6036. It is to be noted that thermal treatment for hydrogenation which is different from the thermal treatment for activation process may be performed. Here, the semiconductor layers can be hydrogenated irrespective of the existence of the first interlayer insulating film 6036. As other means for hydrogenation, means using hydrogen excited by plasma (plasma hydrogenation) or means using thermal treatment at the temperature ranging from 300 to 450° C. for 1 to 12 hours in an atmosphere containing 3 to 100% of hydrogen may be employed.

Subsequently, as shown in FIG. 7B, a second interlayer insulating film 6037 is formed on the first interlayer insulating film 6036. An inorganic insulating film may be used as the second interlayer insulating film 6037. For example, a silicon oxide film formed by a CVD method, a silicon oxide film applied by an SOG (Spin On Glass) method, or the like may be used. In addition, as the second interlayer insulating film 6037, an organic insulating film may be used. For example, a film made of polyimide, polyamide, BCB (benzocyclobutene), acrylic, or the like may be used. Further, a laminated structure of an acrylic film and a silicon oxynitride film may also be used. Also, a laminated structure of acryl film and a silicon nitride film formed by sputtering or a silicon oxynitride film may be used. In this embodiment, an acrylic film in a film thickness of 1.6 μm is formed. The second interlayer insulating film 6037 can reduce unevenness due to the TFTs (the N-channel type TFTs 361 and 362, the P-channel type TFT 363, the N-channel type TFT 364 and the P-channel type TFT 365) and provide levelness. Particularly, the second interlayer insulating film 6037 is provided mainly for attaining levelness, and thus is preferably a film excellent in levelness.

Next, the second interlayer insulating film 6037, the first interlayer insulating film 6036, and a gate insulating film 203 are etched by using dry etching or wet etching, thereby forming contact holes that reach each source region and drain region of the N-channel type TFTs 361 and 362, the P-channel type TFT 363, the N-channel type TFT 364 and the P-channel type TFT 365. Subsequently, wirings 6040 to 6046 and a pixel electrode 6039 which are electrically connected to the source region and the drain region of each TFT are formed. It is to be noted that in this embodiment, the wirings 6040 to 6046 and the pixel electrode 6039 are formed by forming a laminate film of Ti film in a film thickness of 50 nm and an alloy film of Al and Ti in a film thickness of 500 nm continuously by sputtering, and patterning the laminate film in a desired shape. Needless to say, the invention is not limited to a two-layer structure, but a monolayer structure or a laminated structure of three or more layers may be adopted. Further, the materials for wirings are not limited to Al and Ti. For example, the wirings may be formed by patterning a laminate film in which an Al film or a Cu film is formed on a TaN film and a Ti film is further formed thereon. In any cases, a material excellent in reflecting property is desirably used.

Subsequently, an orientation film 6047 is formed over a portion at least including the pixel electrode 6039, and a rubbing process is performed as shown in FIG. 7C. It is to be noted that in this embodiment, a columnar spacer 6048 for maintaining a substrate interval is formed at a desired position by patterning an organic resin film such as an acrylic resin film before the orientation film 6047 is formed. Further, a spherical spacer may be scattered over the surface of the substrate instead of the columnar spacer.

Subsequently, a counter substrate 7000 is prepared. Colored layers (color filters) 7001 to 7003 and a leveling film 7004 are formed over the counter substrate 7000. At this time, the first colored layer 7001 and the second colored layer 7002 are overlapped to form a light shielding portion, and the second colored layer 7002 and the third colored layer 7003 are partially overlapped to form a light shielding portion. Further, the first colored layer 7001 and the third colored layer 7003 may be partially overlapped to form a light shielding portion. In this way, a gap between pixels is shielded against light by the light shielding portion comprised of a lamination layer of the colored layers without newly forming a light shielding portion. The number of steps thus can be reduced.

Then, a counter electrode 7005 formed of a transparent conductive film is formed at least over a portion which corresponds to a pixel portion of the leveling film 7004, and an orientation film 7006 is formed over the whole surface of the substrate of the counter substrate 7005. Then, a rubbing process is performed.

Then, the substrate 201 over which the pixel portion, the driver circuit portion and the functional circuit are formed and the counter substrate 7000 are bonded to each other by a sealing material 7007. The sealing material 7007 is mixed with a filler (not shown), and the two substrates are bonded while a uniform interval is kept by the filler and the columnar spacer 6048. Thereafter, a liquid crystal material 7008 is injected between the two substrates 201 and 7000, and complete sealing is conducted with a sealant (not shown). A known liquid crystal material may be used as the liquid crystal material 7008. Thus, a liquid crystal display device is completed.

Further, a polarizer and an FPC (not shown) are bonded to the liquid crystal display device. By using FPC, a terminal led out from the elements or circuits formed over a substrate 201 is connected to an external signal terminal are connected, thus completed as a product.

It is to be noted that in this embodiment, the reflective liquid crystal display device in which the pixel electrode 6039 is formed with a metal film excellent in reflecting property and a counter electrode 7005 is formed with a material having a translucency is exemplified, but it is not limited to this. For example, the invention can be applied to a transmission type liquid crystal display device in which the pixel electrode 6039 is formed with a material having the translucency and the counter electrode 7005 is formed with a material having the reflecting property. Moreover, the invention also can be applied to a semi-transmission type liquid crystal display device.

The embodiment can be carried out by freely being combined with any one of Embodiment Modes 1 or 2, or Embodiments 1 or 2.

Embodiment 4

In this embodiment, an example of manufacturing an OLED display device in which an OLED element is disposed in each pixel is shown as an example of a display device of Embodiment 1 in which a functional circuit is formed on the same substrate. It should be noted that configurations of the display portion and the functional circuit and TFTs used for the circuits can be made similar to those of Embodiments 1 and 2.

An OLED element has a configuration having an anode, a cathode and an organic compound layer sandwiched between the anode and the cathode. The OLED element emits light by applying a voltage between the anode and the cathode. The organic compound layer can be made in a laminated structure. Representatively, a laminated structure of hole transporting layer/light emitting layer/electron transporting layer is known. Besides, a structure in which hole injection layer/hole transporting layer/light emitting layer/electron transporting layer are laminated in this order on the anode, or hole injection layer/hole transporting layer/light emitting layer/electron transporting layer/electron injection layer are laminated in this order on the anode may be employed. A fluorescent pigment or the like may be doped into the light emitting layer. All of the layers provided between the cathode and the anode of an OLED element is generally referred to as an organic compound layer. Hence, the hole injection layer, hole transporting layer, light emitting layer, electron transporting layer, electron injection layer and the like are all included in the organic compound layer. When the predetermined voltage is applied from a pair of electrodes (anode and cathode) to the organic compound layer of the above-described structure, light is emitted by recombination of carriers being occurred in the light emitting layer. It is to be noted that an OLED element may be of either an element utilizing light emission from singlet exciton (fluorescence) or an element utilizing light emission from triplet exciton (phosphorescence). Since an OLED display device has advantages such that it is excellent in responsibility, operates at a low voltage, and has a wide angular field of view and so forth, it is drawing attention as a flat panel display of the next generation.

In FIGS. 8A to 8D, sectional views of a semiconductor device prepared according to the invention are shown. As for a TFT constituting a pixel portion, a TFT connected in series to an OLED element is representatively shown as the N-channel type TFT 361. Moreover, as an element consisting a pixel driver circuit portion, the N-channel type TFT 362 and the P-channel type TFT 363 are representatively shown. As an element constituting the functional circuit portion, the N-channel type TFT 364 and the P-channel type TFT 365 are representatively shown. Since a method of fabricating the N-channel type TFTs 361 and 362, the P-channel type TFT 363, the N-channel type TFT 364 and the P-channel type TFT 365 is similar to a method of fabrication shown in FIG. 6 in Embodiment 1, the description is omitted here. That is, the N-channel type TFTs 71, the P-channel type TFT 72, the N-channel type TFT 73, and the P-channel type TFT 74 in FIG. 6 can be applied to the N-channel type TFTs 361 and 362, the P-channel type TFT 363, the N-channel type TFT 364, and the P-channel type TFT 365 in FIG. 8 respectively.

According to Embodiment 2, the semiconductor device is fabricated up to the state of FIG. 8A. In FIG. 8B, a first interlayer insulating film 5036 is formed. This first interlayer insulating film 5036 is formed in a film thickness of 100 nm to 200 nm with an insulating film containing silicon by a plasma CVD method or a sputtering method. In this embodiment, a silicon oxynitride film having a film thickness of 100 nm is formed by a plasma CVD method. Needless to say, the first interlayer insulating film 5036 is not limited to the silicon oxynitride film, another insulating film containing silicon may be used as a monolayer structure or a laminated structure. Subsequently, recrystallization of a semiconductor layer and an activation of the impurity element which is added to the semiconductor layer are performed by thermal treatment. This thermal treatment is conducted by thermal annealing using furnace-annealing. As for the thermal annealing, it is conducted at the temperature ranging from 400° C. to 700° C. in the nitrogen atmosphere containing 1 ppm or less, preferably 0.1 ppm or less of oxygen, it is performed at 410° C. for one hour in this embodiment. It is to be noted that laser annealing or rapid thermal annealing (RTA) can be employed besides thermal annealing. Furthermore, the thermal treatment may be conducted before the first interlayer insulating film 5036 is formed. However, in the case where gate wirings of the N-channel type TFTs 361 and 362, the P-channel type TFT 363, the N-channel type TFT 364 and the P-channel type TFT 365 are sensitive to heat, it is preferable to perform the thermal treatment after the first interlayer insulating film 5036 (insulating film having silicon as its main constituent, for example a silicon nitride film) is formed to protect the wirings and the like as in this embodiment.

As described above, when the thermal treatment is conducted after the formation of the first interlayer insulating film 5036 (insulating film having silicon as its main constituent, for example a silicon nitride film), the hydrogenation of the semiconductor layer can also be conducted simultaneously with the activation. In the hydrogenation step, a dangling bond of the semiconductor layer is terminated by hydrogen contained in the first interlayer insulating film 5036. It is to be noted that thermal treatment for hydrogenation which is different from the thermal treatment for activation step may be performed. Here, the semiconductor layers can be hydrogenated irrespective of the existence of the first interlayer insulating film 5036. As other means for hydrogenation, means using hydrogen excited by plasma (plasma hydrogenation) or means using thermal treatment at the temperature ranging from 300° C. to 450° C. for 1 hour to 12 hours in an atmosphere containing 3% to 100% of hydrogen may be employed.

Subsequently, a second interlayer insulating film 5037 is formed over the first interlayer insulating film 5036. An inorganic insulating film may be used as the second interlayer insulating film 5037. For example, a silicon oxide film formed by a CVD method, a silicon oxide film applied by an SOG (Spin On Glass) method, or the like may be used. In addition, as the second interlayer insulating film 5037, an organic insulating film may be used. For example, a film made of polyimide, polyamide, BCB (benzocyclobutene), acrylic, or the like may be used. Further, a laminated structure of an acrylic film and a silicon oxynitride film can also be used. Also, a laminated structure of an acryl film and a silicon nitride film or a silicon nitride oxide film formed by sputtering may be used. In this embodiment, an acrylic film with a thickness of 1.6 μm is formed. The second interlayer insulating film 5037 can reduce unevenness due to the TFTs formed over the substrate 201 and provide levelness. Particularly, the second interlayer insulating film 5037 is provided mainly for attaining levelness, and thus is preferably a film that is excellent in levelness.

Next, the second interlayer insulating film 5037, the first interlayer insulating film 5036, and a gate insulating film 203 are etched by using dry etching or wet etching, thereby forming contact holes that reach each source region and drain region of the N-channel type TFTs 361 and 362, the P-channel type TFT 363, the N-channel type TFT 364 and the P-channel type TFT 365.

Subsequently, a pixel electrode 5038 consisted of a transparent conductive film is formed. For a transparent conductive film, a compound of indium oxide and tin oxide (ITO), a compound of indium oxide and zinc oxide, zinc oxide, tin oxide, indium oxide or the like can be used. Moreover, the matter that gallium is added to the foregoing transparent conductive film may be used. The pixel electrode 5038 corresponds to an anode of an OLED element. In this embodiment, ITO is formed in a film thickness of 110 nm, and the patterning is carried out to form the pixel electrode 5038.

Subsequently, wirings 5039 to 5046 which are electrically connected to the source region and drain region of each TFT respectively (N-channel type TFTs 361 and 362, P-channel type TFT 363, N-channel type TFT 364 and P-channel type TFT 365) are formed. It is to be noted that in this embodiment, the wirings 5039 to 5046 are formed by forming a laminate film of Ti film in a film thickness of 100 nm, an Al film in a film thickness of 350 nm and Ti film in a film thickness of 100 nm continuously by sputtering, and patterning the laminate film in a desired shape. Needless to say, the invention is not limited to a three-layer structure, but a monolayer structure or a two-layer structure or a laminated structure of four or more layers may be adopted. Further, the materials for wirings are not limited to Al and Ti, and another conductive film may be used for wirings. For example, the wirings may be formed by patterning a laminate film in which an Al film or a Cu film is formed on a TaN film and a Ti film is further formed thereon. In this way, one of the source region or the drain region of the N-channel type TFT 361 of the pixel portion is electrically connected to the pixel electrode 5038 via the wiring 5039. Here, the electrical connection is made between the wiring 5039 and the pixel electrode 5038 by superimposing a portion on the pixel electrode 5038 and a portion of the wiring 5039.

Subsequently, as shown in FIG. 8D, a third interlayer insulating film 5047 is formed. As for the third interlayer insulating film 5047, an inorganic and organic insulating films can be used. As an inorganic insulating film, a silicon oxide film formed by a CVD method and a silicon oxide film coated by an SOG (Spin On Glass) method, a silicon nitride film or a silicon oxynitride film formed by a sputtering method or the like can be used. Moreover, as an organic insulating film, an acrylic resin film or the like can be used.

Examples of the combinations of the second interlayer insulating film 5037 and the third interlayer insulating film 5047 are listed as follows: there is a combination in which as the second interlayer insulating film 5037, a laminated film of an acryl and a silicon nitride film or a silicon oxynitride film formed by a sputtering method is used, and as the third interlayer insulating film 5047, a silicon nitride film or a silicon oxynitride film formed by a sputtering method is used. There is a combination in which as the second interlayer insulating film 5037, a silicon oxide film formed by a plasma CVD method is used, and also as the third interlayer insulating film 5047, a silicon oxide film formed by the plasma CVD method is used. Moreover, there is a combination in which as the second interlayer insulating film 5037, a silicon oxide film formed by an SOG method is used, and also as the third interlayer insulating film 5047, a silicon oxide film formed by the SOG method is used. Moreover, there is a combination in which as the second interlayer insulating film 5037, a laminated film of a silicon oxide film formed by an SOG method and a silicon oxide film formed by a plasma CVD method is used, and as the third interlayer insulating film 5047, a silicon oxide film formed by the plasma CVD method is used. Moreover, there is a combination in which as the second interlayer insulating film 5037, an acryl is used, and also as the third interlayer insulating film 5047, an acryl is used. Moreover, there is a combination in which as the second interlayer insulating film 5037, a laminated film of an acryl and a silicon oxide film formed by a plasma CVD method is used, and as the third interlayer insulating film 5047, a silicon oxide film formed by the plasma CVD method is used. Moreover, there is a combination in which as the second interlayer insulating film 5037, a silicon oxide film formed by a plasma CVD method is used, and as the third interlayer insulating film 5047, an acryl is used.

An opening portion is formed at the position corresponding to the pixel electrode 5038 of the third interlayer insulating film 5047. The third interlayer insulating film 5047 functions as an embankment. At the time when the opening portion is formed, the sidewall can be made in a tapered shape by employing a wet etching method. Since the deterioration of an organic compound layer caused by the difference of steps becomes a significant problem if the sidewall of the opening portion is not sufficiently gentle, a considerable care is required. The occurrence of static electricity may be suppressed by adding a carbon particle and a metal particle in the third interlayer insulating film 5047 and by lowering the resistivity. At this time, the additional amount of the carbon particle and the metal particle may be adjusted so that the resistivity becomes in the range from $1\times10^6$ to $1\times10^{12}$ $\Omega$m (preferably, in the range from $1\times10^8$ to $1\times10^{10}$ $\Omega$m).

Subsequently, an organic compound layer 5048 is formed on the pixel electrode 5038 exposed in the opening portion of the third interlayer insulating film 5047. As the organic compound layer 5048, a known organic light emitting material can be used. It should be noted that both of an organic light emitting material and an inorganic light emitting material might be used, or an inorganic light emitting material might be used instead of an organic light emitting material.

As an organic light emitting material, a low molecular organic light emitting material, a high polymeric organic light emitting material and a medium molecular organic light-emitting material can be freely used. It should be noted that the medium molecular organic light emitting material is defined as an organic light emitting material not having the sublimation property and whose degree of polymerization is about 20 or less.

In this embodiment, the organic compound layer 5048 is formed using a low molecular organic light emitting material by a vapor deposition method. Concretely, it is formed with a laminated structure in which a copper phthalocyanine (CuPc) film having a film thickness of 20 nm has been provided as a hole injection layer, and a tris-8-quinolinolatoaluminium complex ($Alq_3$) film having a film thickness of 70 nm is provided thereover as a light emitting layer. The light emitting color can be controlled by adding the fluorescent pigment such as quinacridone, perylene or DCM1 to $Alq_3$.

Moreover, as an example in which a high polymeric organic light emitting material is used, the organic compound layer 5048 may be formed with a laminated structure in which polythiophene (PEDOT) film having a film thickness of 20 nm is provided as a hole injection layer by a spin coating method, and paraphenylene vinylene (PPV) film having a film thickness of about 100 nm is formed thereover as a light emitting layer. It should be noted that if $\pi$ conjugated system high molecule of PPV is used, the light emitting wavelengths from red color to blue color can be selected. Moreover, an inorganic material such as silicon carbide or the like also can be used as an electron transportation layer and electron injection layer.

It should be noted that the organic compound layer 5048 is not limited to an organic compound layer having the laminated structure in which a hole injection layer, a hole transportation layer, a light emitting layer, an electron transportation layer, and an electron injection layer or the like is clearly discriminated. That is, the organic compound layer 5048 may be of a structure having a mixed layer in which materials constituting the hole injection layer, the hole transportation layer, the light emitting layer, the electron transportation layer, and the electron injection layer and the like are mixed. For example, it may be the organic compound layer 5048 having a structure in which a mixed layer consisted of a material constituting the electron transportation layer and a material constituting the light emitting layer is formed between the electron transportation layer and the light emitting layer.

Subsequently, a counter electrode 5049 consisted of an conductive film is provided on the organic compound layer 5048. In the case of this embodiment, an alloy film of aluminum and lithium is used as conductive film. It is to be noted that Mg—Ag film (alloy film made of magnesium and silver) may be used. In this embodiment, the counter electrode 5049 corresponds to a cathode of an OLED element. As a cathode material, conductive film consisted of an element belonging to 1 group or 2 group of the periodic table or conductive film to which these elements are added can be freely used.

An OLED element is completed at the time when the counter electrode 5049 is formed. It is to be noted that the OLED element denotes a diode formed with the pixel electrode (anode) 5038, the organic compound layer 5048 and the counter electrode (cathode) 5049.

It is effective to provide a passivation film 5050 so as to completely cover the OLED element. As the passivation film 5050, an insulating film including a carbon film, a silicon nitride film or a silicon oxynitride film can be used as a monolayer or a laminated layer in which the relevant insulating films are combined. It is preferable that a film excellent in coverage is used as the passivation film 5050, and it is effective that a carbon film, particularly DLC (diamond-like carbon) film is used. Since the DLC film can be formed in a film at a temperature in the range from room temperature to 100° C. or less, it can be easily formed in a film even at the upper portion of the organic compound layer 5048 whose heat resistance is low. Moreover, as the DLC film has a high blocking effect against oxygen, the oxidation of the organic compound layer 5048 can be suppressed.

It should be noted that after the third interlayer insulating film 5047 has been formed, it is effective to continuously conduct the steps up to the step of forming the passivation film 5050 without exposing it to the outside air using a film formation apparatus of a multi-chamber method (or in-line method).

It is actually to be noted that, when the state of FIG. 8D has been completed, it is preferable that it is packaged with a protection film whose sealing property is high and degas is slight (laminated film, ultraviolet curing resin film or the like) or with a sealing member having the translucency so that it is not exposed to the outside air. At that time, if an inactive atmosphere is inputted into the internal portion of the sealing member, or a moisture absorption material (for example, barium oxide) is disposed internally, the reliability of the OLED element is enhanced.

Moreover, as the sealing property has been enhanced by performing the treatment such as packaging or the like, it is completed as a product by mounting a connector (flexible printed circuit: FPC) for connecting a terminal led out from an element or circuit formed over the substrate 201 and an external signal terminal.

The embodiment can be carried out by freely combining it with Embodiment Modes 1 and 2, and Embodiments 1 and 2.

Embodiment 5

In this embodiment, an example of a display system fabricated according to the invention will be described with reference to FIG. 9.

Here, it is defined that a display system is a substrate over which a display device and a CPU portion are formed, which includes a circuit externally added by FPC or the like. As a method of fabricating the display device, those of Embodiments 1 to 3 are used. The configuration example of a display system is shown in FIG. 9.

A circuit having a configuration as shown in FIG. 4 and FIG. 5 is formed over a substrate 500. Here, an example using a circuit having a configuration shown in FIG. 5 is shown. In a display system 700, the substrate 500 is electrically connected to a power supply circuit 701, a clock oscillation circuit 702, a VRAM 703, a ROM 704 and a WRAM 705 by an FPC 710. Here, the power source circuit 701 is a circuit for converting the power source provided into the display system 700 into a power source for the circuit formed over the substrate 500. The clock oscillation circuit 702 is a circuit for inputting a control signal such as a clock signal or the like into a circuit formed over the substrate 500. The VRAM 703 is a circuit for memorizing a video signal in a form of being inputted into a CPU 507. The ROM 704 is a circuit for storing information for controlling the CPU 507 and video signal inputted into the display system 700 are stored. The WRAM 705 is a work region in which the CPU 507 performs processing.

It should be noted that since both of the SRAM 504 provided over the substrate 500 and the WRAM 705 connected by the FPC 710 function as the work region of the CPU 507, either one of them can be omitted. For example, in the case where accesses from the CPU 507 are many, but a relatively small memory capacity may be required, it is preferable to use the SRAM 504, and in reverse, in the case where a large memory capacity is required but the accesses from the CPU 507 is relatively few, it is preferable to use the WRAM 705.

Embodiment 6

In this embodiment, examples of the electronic devices manufactured by using the invention will be described with reference to FIGS. 10A to 10G.

Examples of the electronic devices employing the present invention include a video camera, a digital camera, a goggle type display (head mounted display), a navigation system, an audio reproducing device (such as car audio system and audio component system), a notebook computer, a game machine, a portable information terminal (such as mobile computer, mobile telephone, portable game machine, and electronic book) and an image reproducing device provided with a recording medium (specifically, a device adapted to reproduce a recording medium such as a digital versatile disc (DVD) and provided with a display device capable of displaying an image thereof). FIGS. 10A to 10G show specific examples thereof.

Figure 10A:
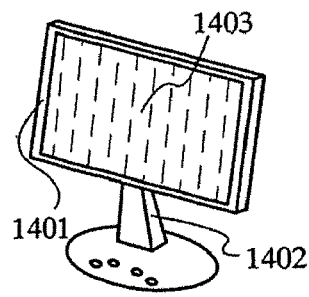
FIGS. 10A to 10G are diagrams showing electronic devices using a semiconductor device and a display device of the present invention.

FIG. 10A shows a display device including a housing 1401, a supporting base 1402, and a display portion 1403. The invention can be applied to the display device, which constitutes the display portion 1403. A small and lightweight display device can be realized by the invention.

Figure 10B:
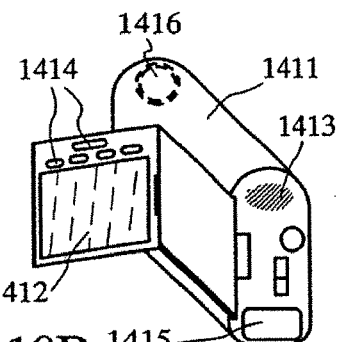

FIG. 10B shows a video camera which is constituted by a main body 1411, a display portion 1412, an audio input portion 1413, operation switches 1414, a battery 1415, a image receiving portion 1416 and the like. The invention can be applied to the display device, which constitutes the display portion 1412. A small and lightweight video camera can be realized by the invention.

Figure 10C:
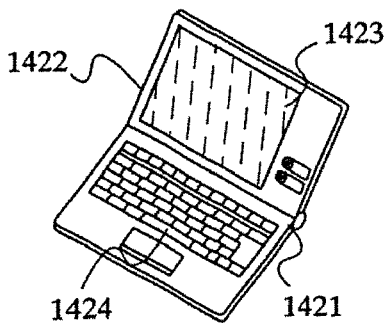

FIG. 10C shows a notebook personal computer which is constituted by a main body 1421, a housing 1422, a display portion 1423, a keyboard 1424 and the like. The invention can be applied to the display device, which constitutes the display portion 1423. Also, the invention can be applied to the semiconductor devices such as a CPU and a memory in the main body 1421. A small and lightweight personal computer can be realized by the invention.

Figure 10D:
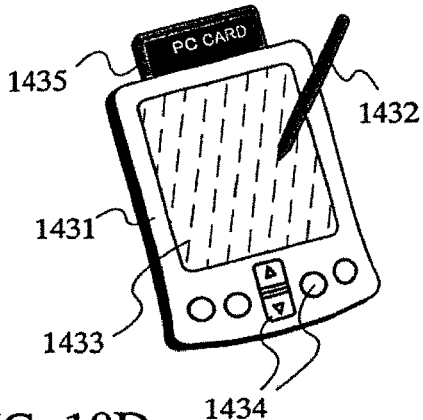

FIG. 10D shows a portable information terminal which is constituted by a main body 1431, a stylus 1432, a display portion 1433, operation keys 1434, an external interface 1435 and the like. The invention can be applied to the display device, which constitutes the display portion 1433. Also, the invention can be applied to the semiconductor devices such as a CPU and a memory in the main body 1431. A small and lightweight portable information terminal can be realized by the invention.

Figure 10E:
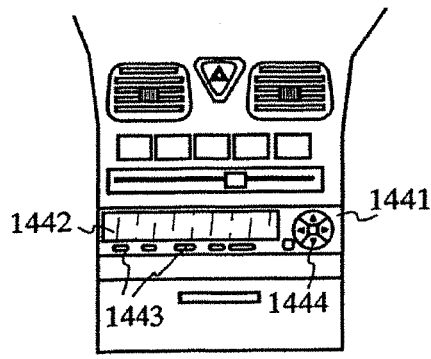

FIG. 10E shows an audio reproducing device, specifically a car audio system, which is constituted by a main body 1441, a display portion 1442, operation switches 1443 and 1444 and the like. The invention can be applied to the display device, which constitutes the display portion 1442. Also, the invention can be applied to the semiconductor devices such as a CPU and a memory in the main body 1441. Further, although the a car audio system is illustrated in this example, the invention may also be used for a portable or household audio system. A small and lightweight audio reproducing device can be realized by the invention.

Figure 10F:
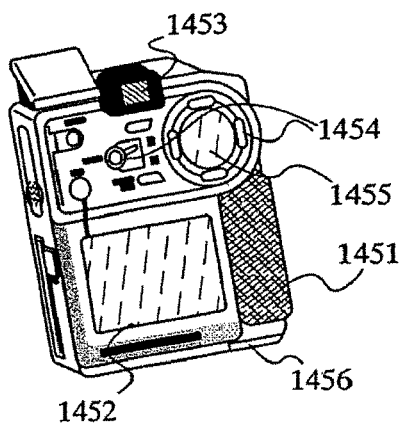

FIG. 10F shows a digital camera, which is constituted by a main body 1451, a display portion (A) 1452, an eyepiece portion 1453, operation switches 1454, display portion (B) 1455, a battery 1456 and the like. The invention can be applied to the display device, which constitutes the display portion (A) 1452 and the display portion (B) 1455. Also, the invention can be applied to the semiconductor devices such as a CPU and a memory in the main body 1451. A small and lightweight digital camera can be realized by the invention.

Figure 10G:
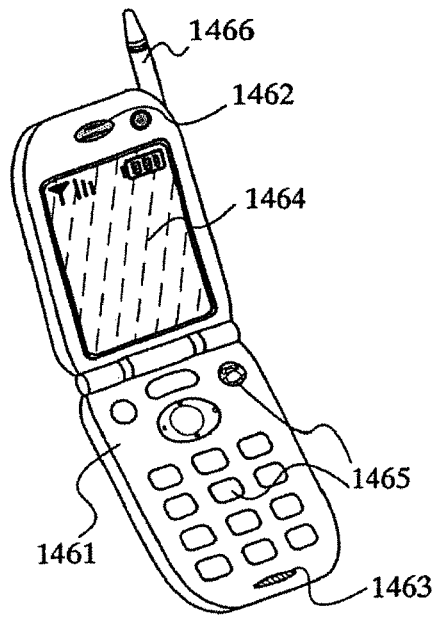

FIG. 10G shows a portable telephone, which is constituted by a main body 1461, an audio output portion 1462, an audio input portion 1463, a display portion 1464, operation switches 1465, an antenna 1466 and the like. The invention can be applied to the display device, which constitutes the display portion 1464. Also, the invention can be applied to the semiconductor devices such as a CPU and a memory in the main body 1461. A small and lightweight portable telephone can be realized by the invention.

Not only a glass substrate but also a heat-resistance plastic substrate can be used for the semiconductor device and the display device used in each of the above electronic devices. Thus, further reduction in weight of the electronic devices can be realized.

The invention is not limited to the afore-mentioned electronic devices but can also include various electronic devices using the semiconductor device and the display device as shown in Embodiments 1 and 2.

In a semiconductor device and a display device having a functional circuit formed by using TFTs, a drop in power supply voltage can be decreased by disposing the power supply wiring and the ground wiring of the functional circuit in a grid-like arrangement. Therefore, it is effective for enhancing the high-speed operation and high performance of the functional circuit. Furthermore, a drop in power supply voltage and a rise in ground voltage can be suppressed to the extent in the case where a grid-like arrangement thereof is not employed, resulting in a decrease in the arrangement area required for the power supply wiring and the ground wiring and an area for the functional circuit can be reduced. Moreover, freedom in design is increased as more arrangement area can be applied to the lead wiring between TFTs even in a high performance functional circuit. Thus, a display device which is lightweight, thin and has high performance can be provided at a low cost.

What is claimed is:

1. A display device comprising:
a display portion formed on a substrate; and
a functional circuit formed on the substrate,
wherein a power supply wiring which supplies power supply voltage to the functional circuit and a ground wiring which supplies ground voltage to the functional circuit are formed in a grid-like arrangement, and
wherein at least one of the power supply wiring and the ground wiring comprises:
a first conductive thin film;
two second conductive thin films;
a third conductive thin film;
a first contact which electrically connects the first conductive thin film and one of the second conductive thin films;
second contacts which electrically connect the first conductive thin film and the third conductive thin film via the other one of the second conductive thin films; and
a third contact which electrically connects the one of the second conductive thin film and the third conductive thin film.

2. The display device according to claim 1,
wherein the functional circuit comprises one selected from the group consisting of a central processing unit, a memory device, a static memory, a dynamic memory, a nonvolatile memory, an image processing circuit, and a digital signal processor.

3. The display device according to claim 1,
wherein a semiconductor thin film formed over a substrate having an insulating surface is used as an active layer of a thin film transistor.

4. The display device according to claim 1,
wherein the substrate having an insulating surface is one selected from the group consisting of a glass substrate, a quartz substrate, a plastic substrate, and an SOI substrate.

5. The display device according to claim 1,
wherein the display device is a liquid crystal display device or a display device using a self light-emitting element.

6. An electronic device comprising the display device according to claim 1.

7. A display device comprising:
a display portion formed on a substrate; and
a functional circuit formed on the substrate,
wherein at least one of a power supply wiring which supplies power supply voltage to the functional circuit and a ground wiring which supplies ground voltage to the functional circuit is formed in a grid-like arrangement, and
wherein the at least one of the power supply wiring and the ground wiring comprises:
a first conductive thin film;
two second conductive thin films;
a third conductive thin film;
a first contact which electrically connects the first conductive thin film and one of the second conductive thin films;
second contacts which electrically connect the first conductive thin film and the third conductive thin film via the other one of the second conductive thin films; and
a third contact which electrically connects the one of the second conductive thin film and the third conductive thin film.

8. The display device according to claim 7,
wherein the functional circuit comprises one selected from the group consisting of a central processing unit, a memory device, a static memory, a dynamic memory, a nonvolatile memory, an image processing circuit, and a digital signal processor.

9. The display device according to claim 7,
wherein a semiconductor thin film formed over a substrate having an insulating surface is used as an active layer of a thin film transistor.

10. The display device according to claim 7,
wherein the substrate having an insulating surface is one selected from the group consisting of a glass substrate, a quartz substrate, a plastic substrate, and an SOI substrate.

11. The display device according to claim 7,
wherein the display device is a liquid crystal display device or a display device using a self light-emitting element.

12. An electronic device comprising the display device according to claim 7.

13. A display device comprising:
a display portion formed on a substrate; and
a functional circuit formed on the substrate,
wherein a power supply wiring which supplies power supply voltage to the functional circuit is formed in a grid-like arrangement, and
wherein the power supply wiring comprises:
a first conductive thin film;
two second conductive thin films;
a third conductive thin film;
a first contact which electrically connects the first conductive thin film and one of the second conductive thin films;
second contacts which electrically connect the first conductive thin film and the third conductive thin film via the other one of the second conductive thin films; and
a third contact which electrically connects the one of the second conductive thin film and the third conductive thin film.

14. The display device according to claim 13,
wherein the functional circuit comprises one selected from the group consisting of a central processing unit, a memory device, a static memory, a dynamic memory, a nonvolatile memory, an image processing circuit, and a digital signal processor.

15. The display device according to claim 13,
wherein a semiconductor thin film formed over a substrate having an insulating surface is used as an active layer of a thin film transistor.

16. The display device according to claim 13,
wherein the substrate having an insulating surface is one selected from the group consisting of a glass substrate, a quartz substrate, a plastic substrate, and an SOI substrate.

17. The display device according to claim 13,
wherein the display device is a liquid crystal display device or a display device using a self light-emitting element.

18. An electronic device comprising the display device according to claim 13.

* * * * *